United States Patent
Yu et al.

(10) Patent No.: US 10,685,867 B2
(45) Date of Patent: *Jun. 16, 2020

(54) METHOD OF SEMICONDUCTOR INTEGRATED CIRCUIT FABRICATION

(71) Applicant: Taiwan Semiconductor Manufacturing Co., Ltd., Hsinchu (TW)

(72) Inventors: De-Wei Yu, Taiwan (TW); Tsu-Hsiu Perng, Hsinchu County (TW); Ziwei Fang, Hsinchu (TW)

(73) Assignee: TAIWAN SEMICONDUCTOR MANUFACTURING CO., LTD., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/173,492

(22) Filed: Oct. 29, 2018

(65) Prior Publication Data

US 2019/0067083 A1    Feb. 28, 2019

Related U.S. Application Data

(62) Division of application No. 15/197,984, filed on Jun. 30, 2016, now Pat. No. 10,115,624.

(51) Int. Cl.
| | |
|---|---|
| *H01L 21/762* | (2006.01) |
| *H01L 21/02* | (2006.01) |
| *H01L 29/06* | (2006.01) |
| *H01L 29/78* | (2006.01) |
| *H01L 29/66* | (2006.01) |
| *H01L 21/768* | (2006.01) |
| *H01L 21/285* | (2006.01) |

(52) U.S. Cl.
CPC .. *H01L 21/76224* (2013.01); *H01L 21/02354* (2013.01); *H01L 21/768* (2013.01); *H01L 21/76825* (2013.01); *H01L 21/76828* (2013.01); *H01L 29/0653* (2013.01); *H01L 29/66545* (2013.01); *H01L 29/66795* (2013.01); *H01L 29/7851* (2013.01); *H01L 21/28518* (2013.01); *H01L 21/76897* (2013.01)

(58) Field of Classification Search
None
See application file for complete search history.

(56) References Cited

U.S. PATENT DOCUMENTS

| 6,987,064 B2 | 1/2006 | Chuang et al. |
| 7,163,899 B1 | 1/2007 | Cho et al. |

(Continued)

*Primary Examiner* — Andres Munoz
(74) *Attorney, Agent, or Firm* — Haynes and Boone, LLP

(57) ABSTRACT

A method of semiconductor device fabrication includes providing a substrate having a hardmask layer thereover. The hardmask layer is patterned to expose the substrate. The substrate is etched through the patterned hardmask layer to form a first fin element and a second fin element extending from the substrate. An isolation feature between the first and second fin elements is formed, where the isolation feature has a first etch rate in a first solution. A laser anneal process is performed to irradiate the isolation feature with a pulsed laser beam. A pulse duration of the pulsed laser beam is adjusted based on a height of the isolation feature. The isolation feature after performing the laser anneal process has a second etch rate less than the first etch rate in the first solution.

20 Claims, 23 Drawing Sheets

(56) References Cited

U.S. PATENT DOCUMENTS

| | | |
|---|---|---|
| 7,667,271 B2 | 2/2010 | Yu et al. |
| 8,362,575 B2 | 1/2013 | Kwok et al. |
| 8,367,498 B2 | 2/2013 | Chang et al. |
| 8,440,517 B2 | 5/2013 | Lin et al. |
| 8,497,528 B2 | 7/2013 | Lee et al. |
| 8,519,538 B2 | 8/2013 | Hsia et al. |
| 8,546,209 B1 | 10/2013 | Cheng et al. |
| 8,610,240 B2 | 12/2013 | Lee et al. |
| 8,674,470 B1 | 3/2014 | Or-Bach et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,735,252 B2 | 5/2014 | Yu et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,921,218 B2 | 12/2014 | Yang et al. |
| 8,962,400 B2 | 2/2015 | Tsai et al. |
| 8,993,417 B2 | 3/2015 | Tsai et al. |
| 9,093,514 B2 | 7/2015 | Tsai et al. |
| 9,130,058 B2 | 9/2015 | Chen et al. |
| 9,245,805 B2 | 1/2016 | Yeh et al. |
| 9,246,002 B2 | 1/2016 | Hsiao et al. |
| 9,299,803 B2 | 3/2016 | Tsai et al. |
| 9,406,546 B2 | 8/2016 | Tsai et al. |
| 9,443,980 B2 | 9/2016 | Jensen et al. |
| 9,472,636 B2 | 10/2016 | Zhu et al. |
| 9,812,451 B2 | 11/2017 | Liu et al. |
| 10,115,624 B2 * | 10/2018 | Yu .................. H01L 21/76224 |
| 2011/0014726 A1 | 1/2011 | Yu et al. |

\* cited by examiner

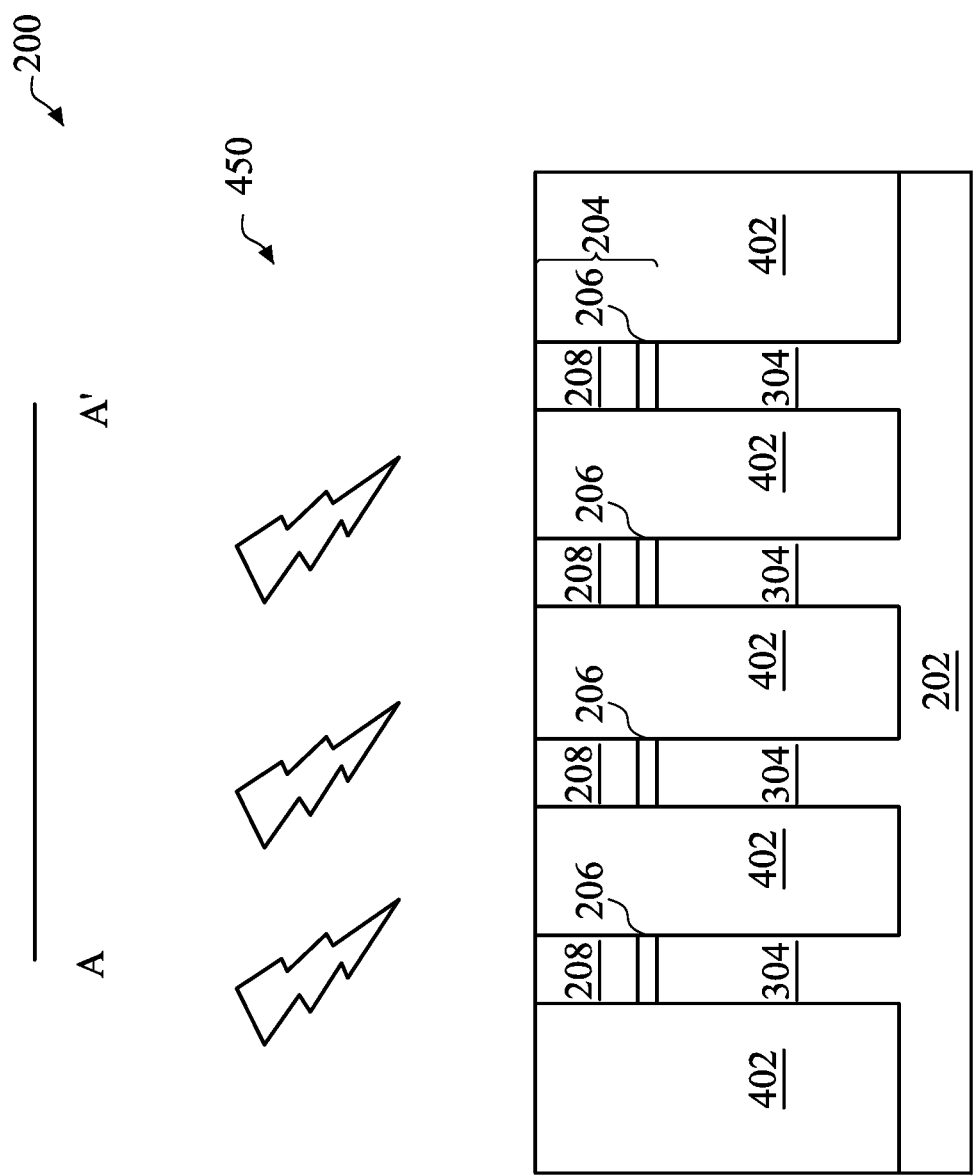

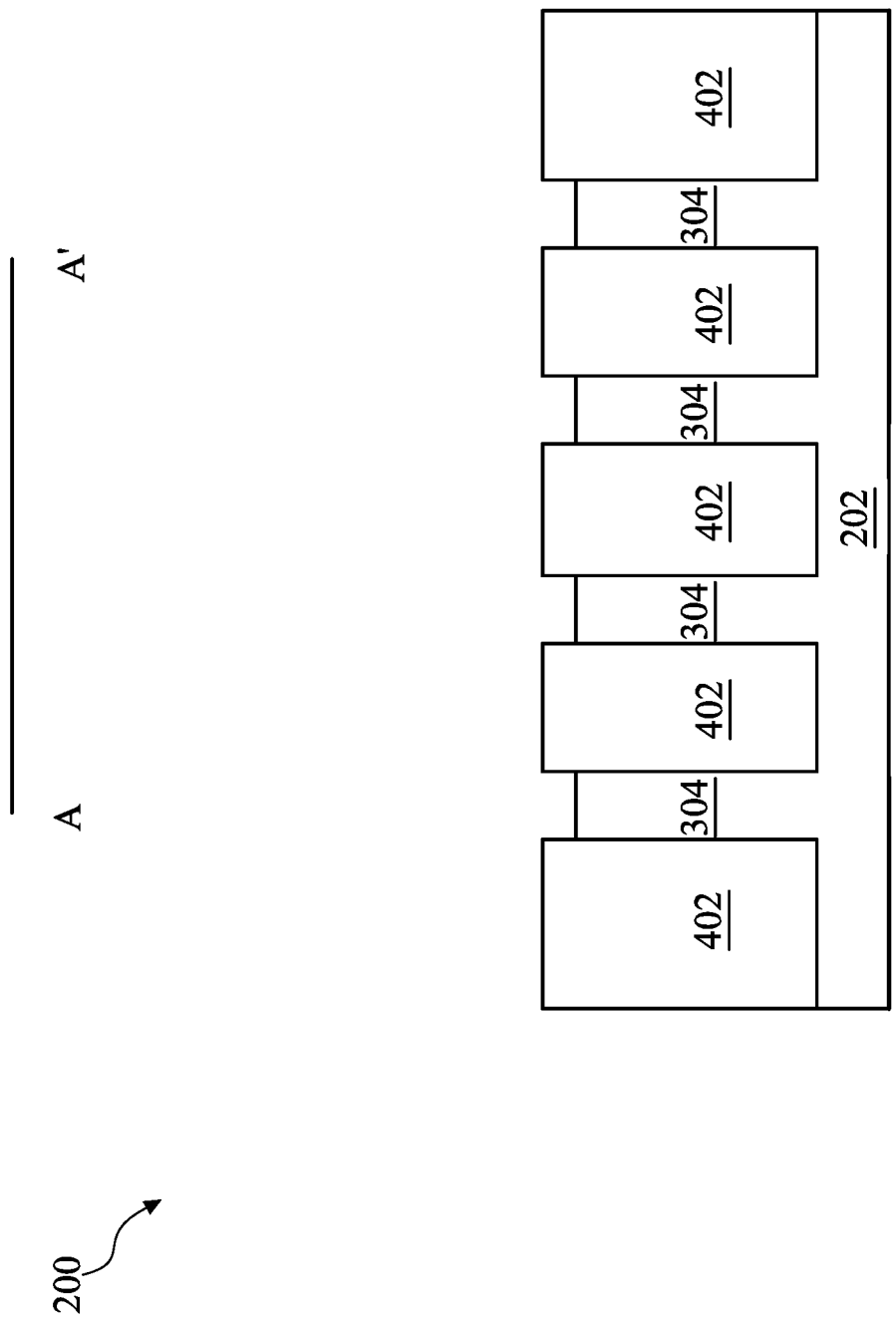

METHOD OF SEMICONDUCTOR INTEGRATED CIRCUIT FABRICATION

PRIORITY DATA

This application is a divisional application of U.S. application Ser. No. 15/197,984, filed Jun. 30, 2016, issuing as U.S. Pat. No. 10,115,624, entitled "METHOD OF SEMICONDUCTOR INTEGRATED CIRCUIT FABRICATION", hereby incorporated by reference in its entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

For example, when fabricating field effect transistors (FETs), such as fin-like FETs (FinFETs), flowable chemical vapor deposition (FCVD) processes are frequently used in forming a dielectric material layer over a substrate. A typical FCVD process deposits a dielectric material on the substrate to fill trenches. An annealing process may be used to reduce a wet etch rate of the deposited dielectric material. However, the annealing process might induce undesired dopant diffusion into channel regions (e.g., from a previously doped substrate region), have a negative impact on strained features already existent in the substrate, and/or cause undesired bending of the fin elements. An implantation process may also be used to reduce the wet etch rate of the deposited material. However, such implantation process may induce damage to the fin elements, which may not be fully recovered by a subsequent thermal treatment. In addition, such subsequent thermal treatment may induce defects (e.g., twin defects) in the substrate and fin elements. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B are cross-sectional views of a portion of a semiconductor device according to some embodiments.

FIGS. 6A and 6B are cross-sectional views of a portion of a semiconductor device according to some embodiments.

DETAILED DESCRIPTION

Figure 1:
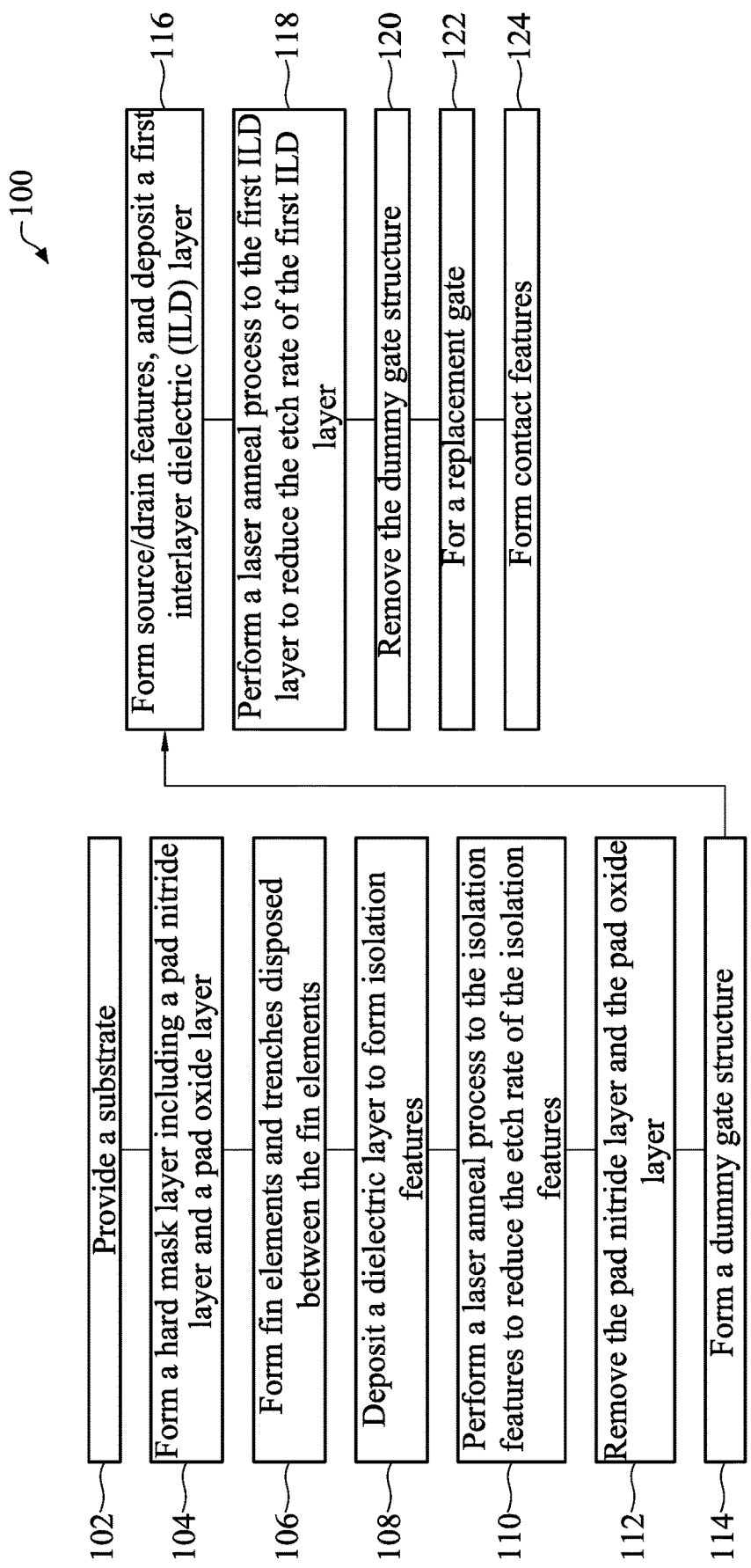
FIG. 1 is a flow chart of a method of forming a semiconductor device or portion thereof according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of fin-type transistors referred to herein as FinFET devices. Such a device may include a P-type metal-oxide-semiconductor (PMOS) FinFET device or an N-type metal-oxide-semiconductor (NMOS) FinFET device. While FinFET devices are used as examples to describe the present disclosure, they are not intended to limit the present disclosure beyond what is explicitly recited in the claims. One of skill in the art in possession of the present disclosure will recognize that a variety of devices, for example, various types of transistors and diodes, will benefit from the teachings herein and thus fall within the scope of the present disclosure.

Illustrated in FIG. 1 is a method 100 of semiconductor fabrication including fabricating FinFET devices. It is understood that the method 100 includes steps having features of a complementary metal-oxide-semiconductor (CMOS) technology process flow and thus, are only described briefly herein. Additional steps may be performed before, after, and/or during the method 100.

Figure 2:
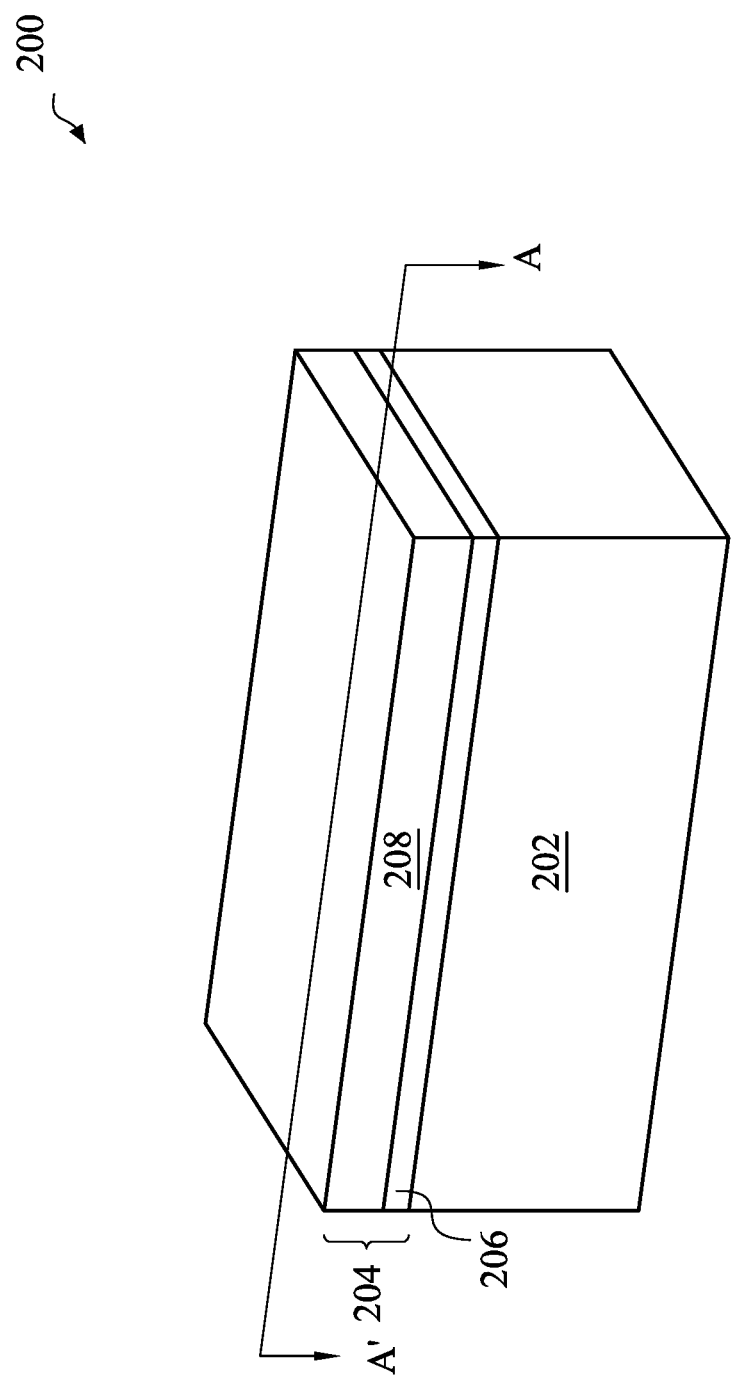
FIG. 2 is an isometric view of a portion of a semiconductor device according to some embodiments.

Referring to FIGS. 1 and 2, the method 100 begins at block 102 where a substrate 202 is provided. In some embodiments, the substrate 202 may be a semiconductor substrate such as a silicon substrate. In some embodiments, the substrate 202 may include various layers, including conductive or insulating layers, formed on a semiconductor substrate. In some embodiments, the substrate 202 is a contiguous silicon substrate. The substrate 202 may include various doping configurations depending on design requirements. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOT) structure, and/or have other suitable enhancement features.

The method 100 then proceeds to block 104, where a hard mask layer 204 is formed over the substrate 202. Referring to FIG. 2, the substrate 202 includes a hard mask layer 204 disposed thereon. The hard mask layer 204 may include an oxide layer 206 (e.g., an oxide layer that may include $SiO_2$) and a nitride layer 208 (e.g., a nitride layer that may include $Si_3N_4$) formed over the oxide layer 206. In some examples, the hard mask layer 204 includes thermally grown oxide, chemical vapor deposition (CVD)-deposited oxide, and/or ALD-deposited oxide. In some embodiments, the hard mask layer 204 includes a nitride layer deposited by CVD or other suitable technique. The hard mask layer 204 may be used to protect portions of the substrate 202 and/or used to define a pattern (e.g., fin elements) illustrated below. By way of example, the oxide layer 206 of the hard mask layer 204 may have a thickness of between approximately 5 nanometers (nm) and approximately 40 nm. In some embodiments, the nitride layer 208 of the hard mask layer 204 may have a thickness of between approximately 20 nm and approximately 160 nm.

Figure 3:
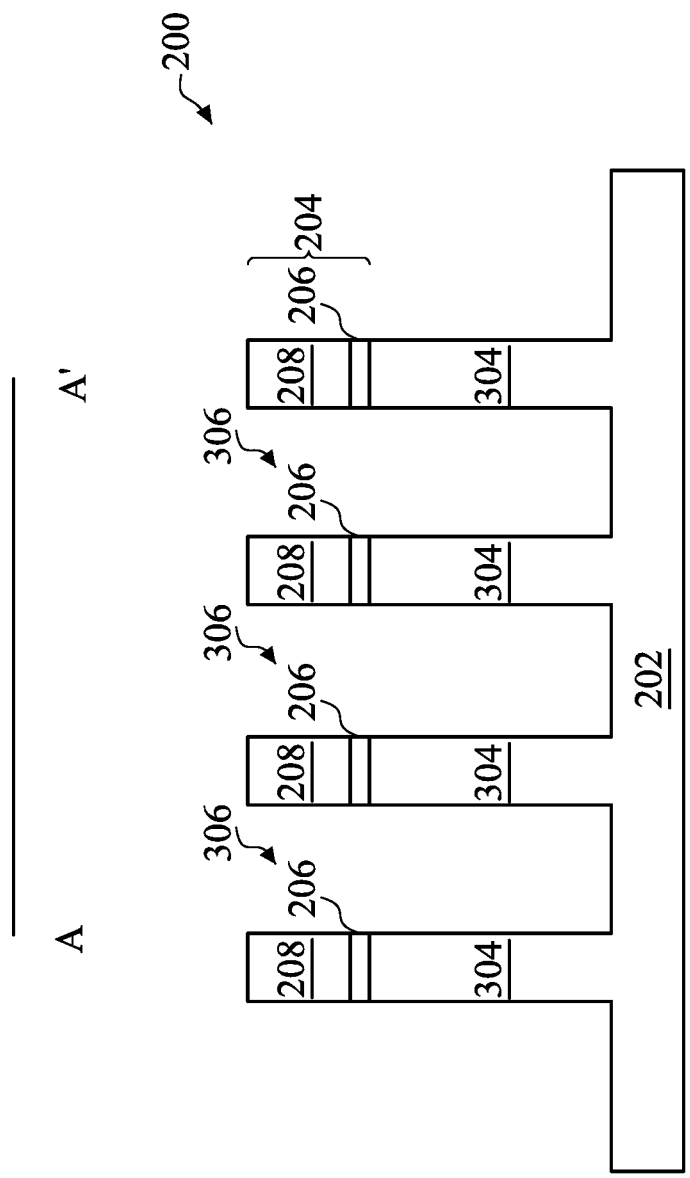
FIG. 3 is a cross-sectional view of a portion of a semiconductor device according to some embodiments.

Referring to FIGS. 1 and 3, the method 100 then proceeds to block 106, where fin elements are formed for use in subsequent FinFET formations. In FIG. 3, the substrate 202 includes a plurality of fin elements 304 extending from the substrate 202. While the exemplary FIG. 3 illustrates four fin elements, the substrate 202 may include any number of fin elements, and any number of fin elements may be associated with a given gate structure.

The fin elements 304, as described with reference to the substrate 202, may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fin elements 304 may be fabricated using suitable processes including photolithography and etching processes. The photolithography process may include forming a photoresist layer including a resist over the hard mask 204, exposing the resist to a pattern, performing post-exposure bake processes, and developing the resist to form a masking element including the resist. In some embodiments, patterning the resist to form the masking element may be performed using an electron beam (e-beam) lithography process. The patterned masking element may then be used to protect regions of the substrate 202, and layers formed thereupon, while an etching process forms trenches 306 in unprotected regions through the patterned masking element and into the substrate 202, thereby leaving the plurality of extending fin elements 304. The trenches 306 between fin elements 304 may be etched using a dry etching (e.g., reactive ion etching), a wet etching, and/or other suitable processes. Numerous other embodiments of methods to form the fin elements on the substrate may also be used.

Figure 4A:
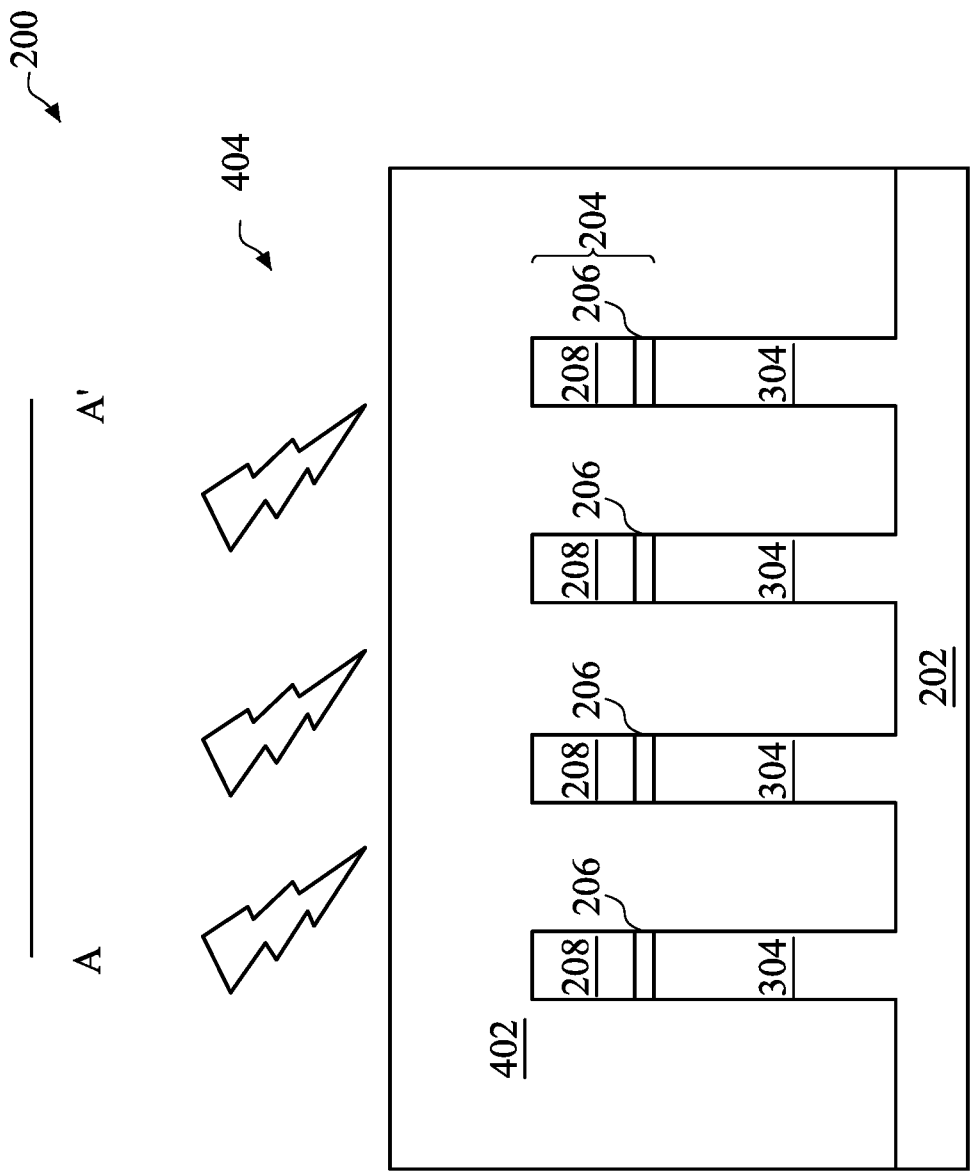

Referring to FIGS. 1, 4A, and 4B, the method 100 then proceeds to block 108, where isolations features are formed between the fin elements. The isolation features may be shallow trench isolation (STI) features. As illustrated in the example of FIG. 4A, a dielectric layer 402 is formed by depositing a flowable dielectric material over the substrate 202, which fills the trenches 306 interposing the fin elements 304. In some embodiments, the dielectric material may include $SiO_2$, silicon nitride, silicon oxynitride, silicon carbon nitride (SiCN), silicon oxycarbonitride (SiOCN), doped silicon oxide such as fluorine-doped silicate glass (FSG), a low-k dielectric material, combinations thereof, and/or other suitable materials. In some embodiments, the dielectric layer (and subsequently formed Isolation features) may include a multi-layer structure, for example, having one or more liner layers. In various examples, the dielectric material may be deposited by a chemical vapor deposition (CVD) process, a subatmospheric CVD (SACVD) process, a flowable CVD process, an atomic layer deposition (ALD) process, a physical vapor deposition (PVD) process, and/or other suitable process.

Referring to the example of FIG. 4A, in some embodiments, block 108 continues to include performing an annealing process 404 to treat the dielectric layer 402. In some examples, the annealing process 404 converts a flowable dielectric material of the dielectric layer 402, at least partially, to a dense oxide material. In some examples, the annealing process 404 enhances the quality of the dielectric layer 402 through solvent out-diffusion and/or cross-linking. In some examples, the annealing process 404 is conducted in an oxidizing ambient, a combination of steam ambient and oxygen ambient, or under an inert gas atmosphere. In some embodiments, the annealing process 404 includes placing the device 200 in a furnace, where the furnace is heated to a particular annealing temperature. The annealing process 404 meets certain thermal budget by controlling the annealing parameters, for example, the annealing temperature and the annealing duration. In some examples, the annealing process 404 is performed at an annealing temperature between about 850° C. and about 1,150° C. for a duration between about 0.5 seconds to about 2 hours. In some examples, the annealing process 404 is performed at an annealing temperature between about 200° C. and about 850° C. for a duration from about 10 minutes to about 2 hours.

In various embodiments, the dielectric layer 402 may be a relatively thick layer. In one example, the dielectric layer 402 has a thickness of about 200 nm as it is first deposited. Consequently, the annealing process 404 may not be able to penetrate such a thick layer. Accordingly, further operations are performed to fully treat the dielectric layer 402. To further these embodiments, block 108 continues to perform a chemical mechanical planarization (CMP) process to the dielectric layer 402 to thin it down, and thereafter, then proceeds to perform another annealing process to fully convert the flowable dielectric material of the dielectric layer 402 to a dense oxide material.

Referring to the example of FIG. 4B, the dielectric layer 402 has been thinned and planarized, for example by a chemical mechanical polishing (CMP) process, to form isolation features as illustrated in FIG. 4B. The dielectric layer 402 is referred to as isolation features 402 in subsequent steps.

As illustrated in the example of FIG. 4B, after the CMP process is completed, another annealing process 450 is performed to the substrate 202 to treat the isolation features 402. The annealing process 450 may be substantially similar to the annealing process 404 discussed above with reference to FIG. 4A. The annealing process 450 fully penetrates the isolation features 402 and converts them to a dense oxide layer. In some embodiments, the annealing process 450 includes placing the device 200 in a furnace, where the furnace is heated to a particular annealing temperature. In an embodiment, the annealing process 450 is performed at an annealing temperature between about 850° C. and about 1,150° C. for a duration between about 0.5 seconds to about 2 hours. In some examples, the annealing process 404 is performed at an annealing temperature between about 200° C. and about 850° C. for a duration from about 10 minutes to about 2 hours.

Figure 5:
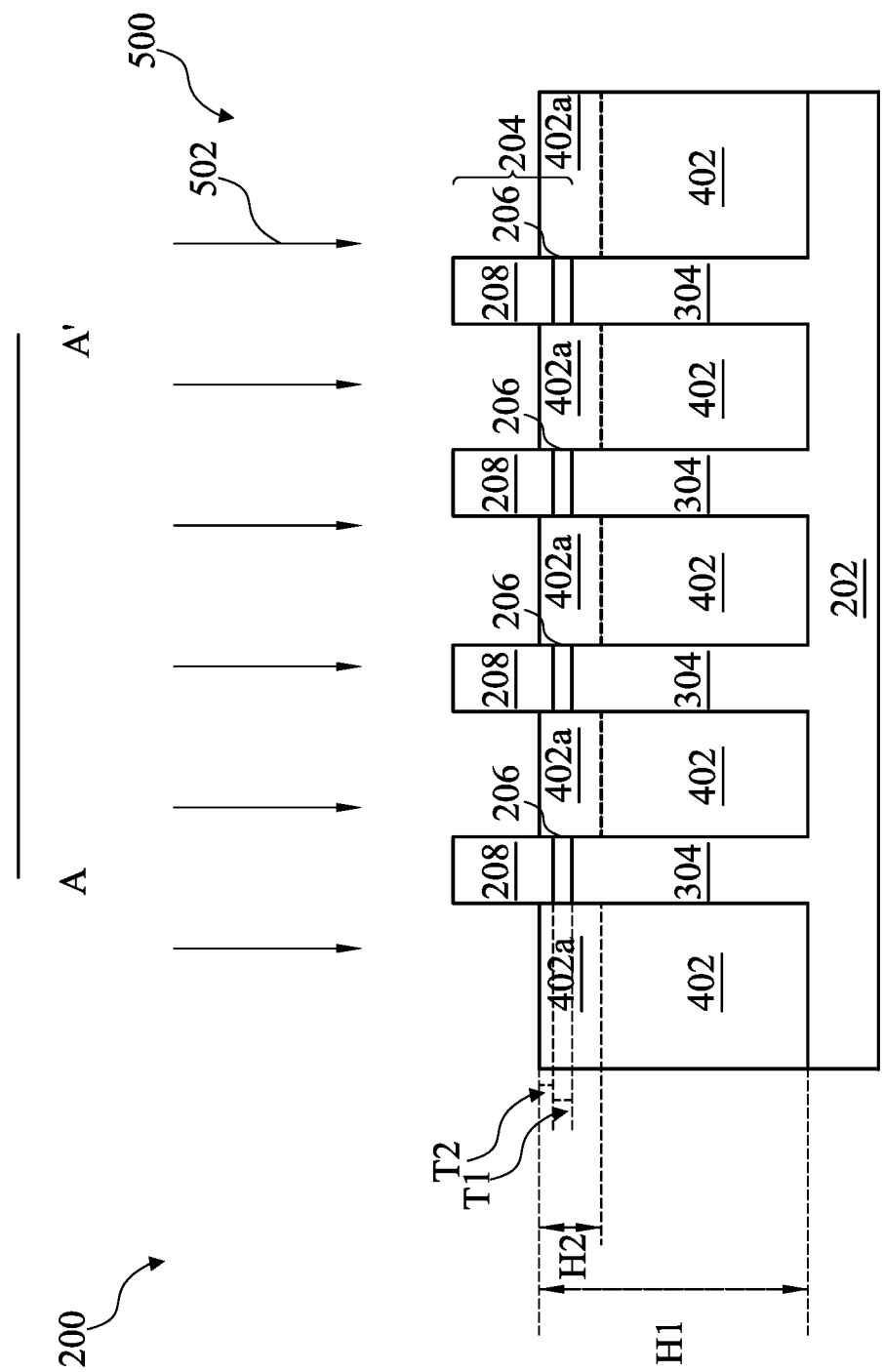
FIG. 5 is a cross-sectional view of a portion of a semiconductor device according to some embodiments.

Referring to FIGS. 1 and 5, the method 100 proceeds to block 110, where a laser anneal process is performed to the isolation features to reduce the wet etch rate of the isolation features. In some embodiments, block 110 includes recessing the isolation features 402 prior to the performing the laser anneal process, so that a portion of the nitride layer 208 extends above a top surface of the isolation features 402. In some embodiments, the recessing process may include a dry etching process, a wet etching process, and/or a combination thereof. In some embodiments, a recessing depth is controlled (e.g., by controlling an etching time) so as to result in a desired distance T2 between a top surface of the isolation features 402 and a top surface of the oxide layer 206. In some examples, the distance T2 is between approximately 2 nm and approximately 10 nm.

As illustrated in FIG. 5, block 110 includes performing a laser anneal process 500 which irradiates the substrate with laser beam 502. In some embodiments, the laser anneal process uses a laser operating in a pulsed mode at a pulsing frequency (repetition rate), and is referred to as a pulsed laser anneal process. In some examples, the pulsed laser anneal process may be controlled by tuning laser anneal parameters (e.g., wavelength, pulse duration (pulse width), pulse energy density, number of pulses, repetition rate) to achieve the desired wet etch rate of the isolation features.

In some embodiments, the laser anneal process 500 reduces an etch rate of the isolation features 402 in a particular solution by about 5% and up to about 50%. In an example, the particular solution (e.g., a diluted hydrofluoric acid (HF) solution) is used in subsequent etch steps to remove the oxide layer 206 as described below. In some embodiments, the reduction of the etch rate is caused by the formation of stronger bonds during the laser anneal process. In some examples, bonds (e.g., Si—N, Si—H, H—N bonds) having weaker bond energies in the isolation features 402 are broken, and bonds (e.g., Si—O bonds) having stronger bond energies are formed in the isolation features 402. In some examples, weaker Si—O bonds (e.g., where a silicon atom is bonded to less than four oxygen atoms) in the isolation features 402 break by the laser anneal process 500, and re-bond to form stronger Si—O bonds (e.g., silicon-oxygen tetrahedron where each silicon atom is bonded to four oxygen atoms) during a cooling process. In some examples, the laser anneal process reduces dangling Si bonds in the isolation features 402, where the dangling Si bonds react with oxygen to form Si—O bonds. In some embodiments, normalized Fourier Transform Infrared (FTIR) spectroscopy can be used to detect the change of the status of Si—O bonds (e.g., the asymmetric stretch mode) and evaluate the quality of silicon oxide.

In some embodiments, during the laser anneal process 500, the isolation features 402 have a temperature (e.g., in a range of from about 1200° C. to about 1400° C.) lower than the melting point (e.g., 1600° C.) of the isolation features 402. Such a laser anneal process may also be referred to as a sub-melt laser anneal process. In some embodiments, during the laser anneal process 500, the isolation features 402 have a temperature equal to or greater than the melting point of the isolation features 402. Such a laser anneal process may also be referred to as a melt laser anneal process.

In some embodiments, an anneal depth of the laser anneal process 500 indicates a depth of a portion of the isolation features 402 that is annealed by the laser anneal process 500 to improve the wet etch rate. In some embodiments, the laser anneal parameters are tuned based on the height H1 of the isolation features 402 so that an anneal depth of the laser anneal process 500 is equal to or greater than the height H1. In such embodiments, the entire isolation features 402 are annealed by the laser anneal process 500.

In some embodiments, the laser anneal parameters are tuned so that an anneal depth (e.g., H2) of the laser anneal process 500 is less than the height H1. As such, the thermal changes caused by the laser anneal process 500 are constrained in a top portion (e.g., a portion 402a), which help lower the thermal budget of the laser anneal process 500. In such embodiments, the laser anneal process 500 reduces an etch rate of the top portion 402a, while an etch rate of the bottom portion of the isolation features 402 remains substantially unchanged during the laser anneal process 500. As illustrated in FIG. 5, in some examples, the anneal depth is greater than a total of a thickness T1 of the oxide layer 206 and a distance T2 between a top surface of the isolation features 402 and a top surface of the oxide layer 206. By reducing the etch rate of at least the top portion of the isolation features 402, a better isolation feature divot control may be achieved in subsequent steps removing the oxide layer 206.

In some examples, the laser anneal process uses a pulsed laser beam 502 having a wavelength ranging from about 300 nm to about 600 nm (e.g., 500 nm), a pulse duration ranging from about 2 ns to about 200 ns (e.g., 10 ns), and a laser pulse energy density ranging from about 1 mJ/cm$^2$ to about 10 J/cm$^2$ (e.g., 300 mJ/cm$^2$). In an example, the pulsed laser beam 502 irradiates a 10 mm by 10 mm area of the surface of the isolation features 402 using about 1 to 100 pulses (e.g., 30 pulses), and is stepped to cover the surface of the isolation features 402.

Figure 6A:
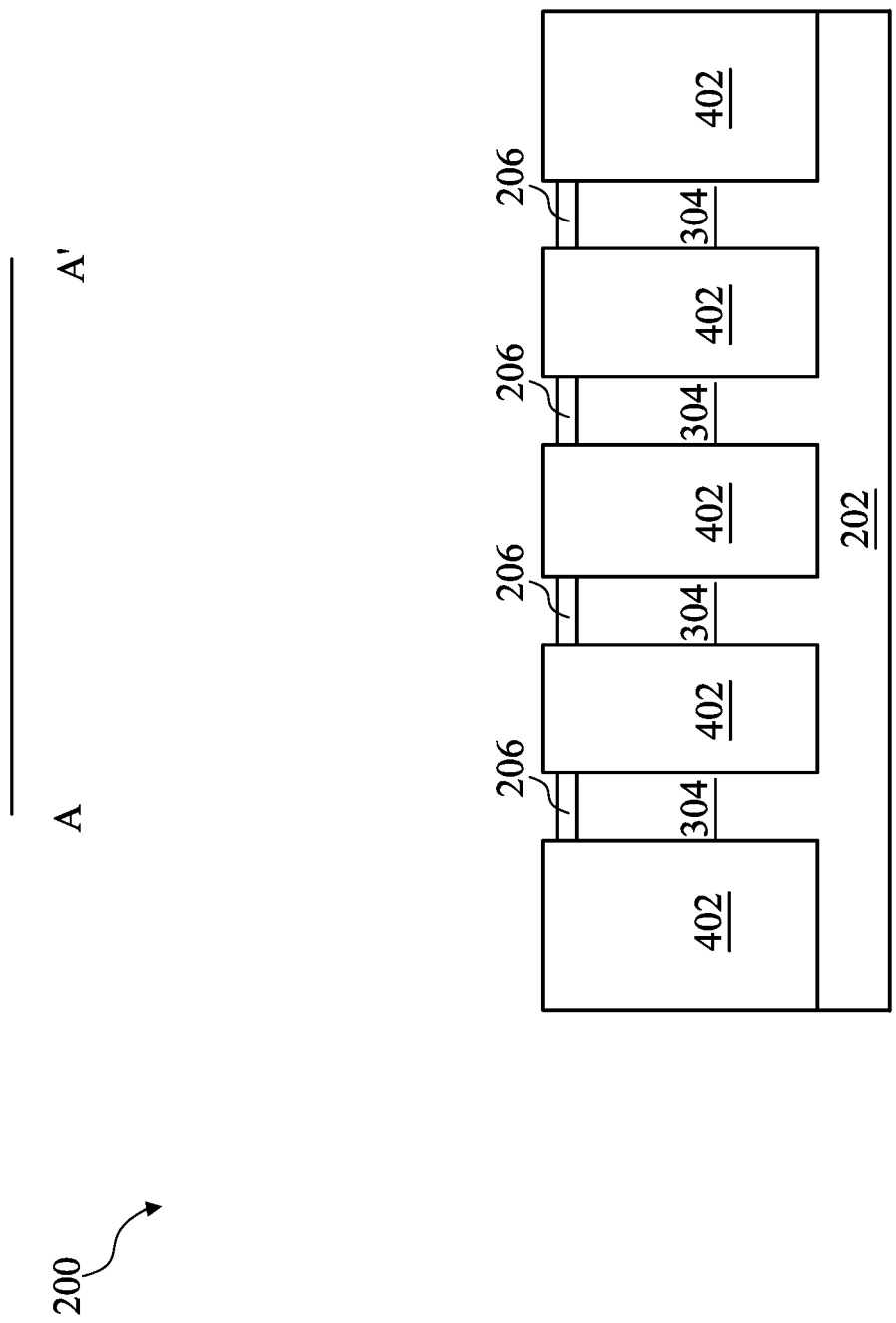

Referring to FIGS. 1, 6A, and 6B, the method 100 then proceeds to block 112, where the nitride layer and the oxide layer are removed. Referring to the example of FIG. 6A, the nitride layer 208 has been removed to expose a top surface of the oxide layer 206 by an nitride layer etching process, which selectively removes the nitride layer 208 without etching the isolation features 402 or the oxide layer 206. In some embodiments, the nitride layer etching process may include a dry etching process, a wet etching process, and/or a combination thereof. In some examples, a wet etching process using phosphoric acid is used to remove the nitride layer 208. The isolation features 402 and the oxide layer 206 remain substantially unchanged during the wet etching process.

In some embodiments, block 112 continues to include performing one or more ion implantation processes to implant dopants at a predetermined distance below the substrate surface to form well regions of the substrate 202. A rapid thermal anneal process is performed to activate the dopants.

In some embodiments, block 112 continues to include removing the oxide layer 206. Referring to the example of FIG. 6B, the oxide layer 206 has been removed to expose a top surface of the fin elements 304. The oxide layer 206 may be etched by an oxide layer etching process. The oxide layer etching process may include a dry etching process, a wet etching process, and/or a combination thereof. In a particular example, a wet etching process using a diluted (e.g., 1/100 diluted by volume) hydrofluoric acid (HF) solution is performed to remove the oxide layer 206. In such example, because the wet etch rate of at least the top portion of the isolation features 402 in such solution is reduced, a better isolation feature divot control is achieved.

Figure 7:
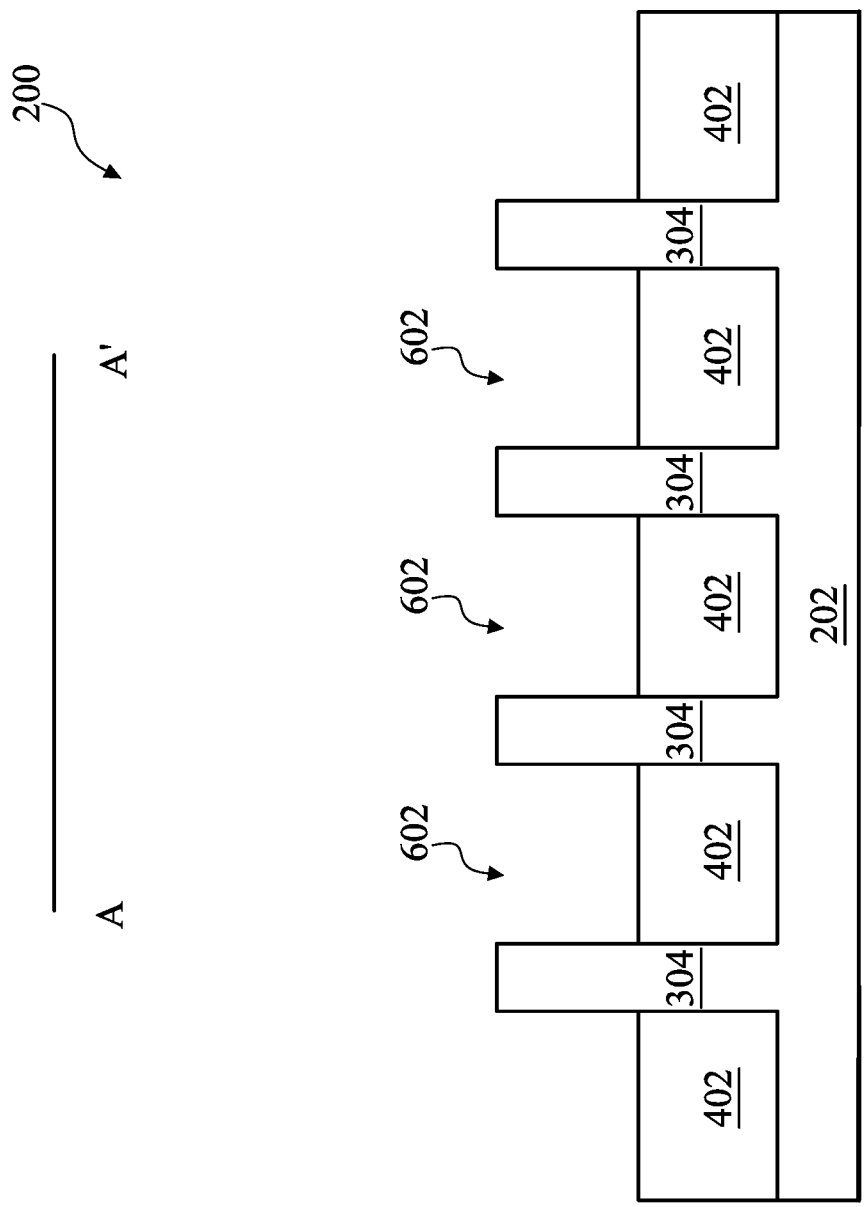
FIG. 7 is a cross-sectional view of a portion of a semiconductor device according to some embodiments.

In some embodiments, block 112 continues to include recessing the isolation features to expose the fin elements. Referring to FIG. 7, the isolation features 402 have been recessed to provide fin elements 304 extending above a top surface of the isolation features 402. In some embodiments, the recessing process may include a dry etching process, a wet etching process, and/or a combination thereof. In some embodiments, a recessing depth is controlled (e.g., by controlling an etching time) so as to result in a desired height of the exposed upper portion of the fin elements 304. In an embodiment, the height of the exposed upper portion of the fin elements 304 is between approximately 30 nm and approximately 60 nm.

Figure 8A:
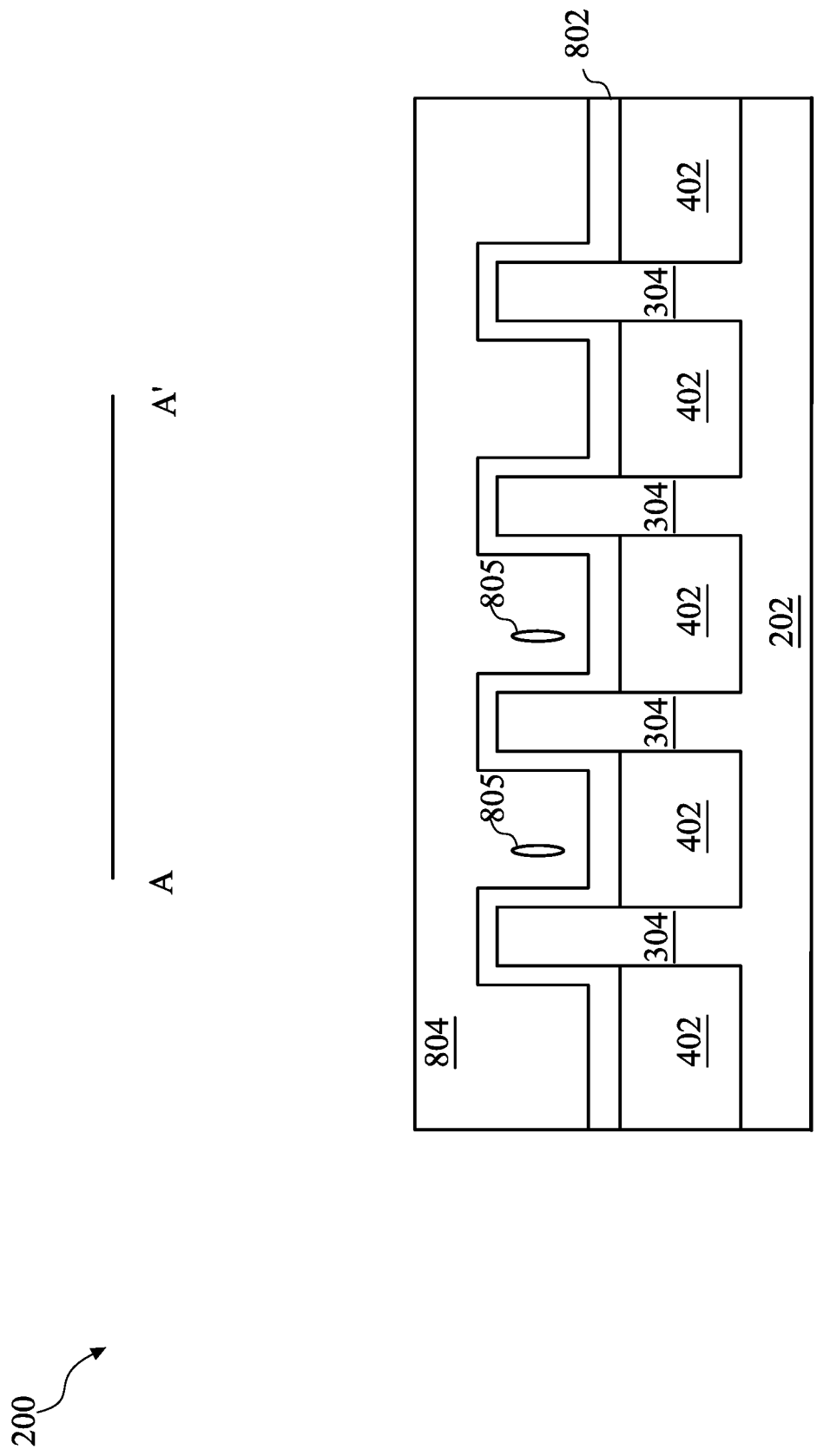
FIG. 8A is a cross-sectional view of a portion of a semiconductor device according to some embodiments.

Referring to FIGS. 1, 8A, 8B, and 8C, the method 100 then proceeds to block 114, where a dummy gate structure is formed over the fin elements. Referring to FIG. 8A, a dielectric material 802 (also referred to as dummy gate dielectric material 802) is formed over the substrate. In some embodiments, the dielectric material 802 is also referred to as a dummy insulating layer or a dummy oxide layer of a dummy gate structure; however, the constraint to an oxide composition is not particularly required. In an embodiment, the dielectric material 802 also forms an I/O oxide. The dielectric material 802 may be formed by atomic layer deposition (ALD) and/or other suitable processes.

As illustrated in FIG. 8A, a dielectric material 802 is disposed on the fin elements 304 and/or on the surface of the isolation features 402. In some embodiments, the dielectric material 802 may include $SiO_2$. However, in other embodiments, a dielectric material 802 having other compositions is possible, including, for example, silicon nitride, silicon oxynitride, silicon carbon nitride (SiCN), silicon oxycarbonitride (SiOCN), a high-k dielectric material or other suitable material. In some embodiments, the dielectric material 802 has a height, for example, between about 5 nm and about 20 nm.

In various examples, the dielectric material 802 may be deposited by a CVD process, a subatmospheric CVD (SACVD) process, a flowable CVD process, an ALD process, a PVD process, or other suitable process. By way of example, the dielectric material 802 may be used to prevent damage to the fin elements 304 by subsequent processing (e.g., subsequent formation of a dummy gate electrode layer).

In some embodiments, an electrode layer 804 (also referred to as dummy gate electrode layer 804) is formed over the dummy gate dielectric material 802. In some embodiments, the electrode layer 804 includes amorphous silicon or polycrystalline silicon (polysilicon). In some embodiments, the electrode layer 804 may be formed by a CVD process, a Plasma Enhanced Chemical Vapor Deposition (PECVD) process, a PVD process, or other suitable process. In some embodiments, the crystallographic nature of the silicon deposited depends upon the temperature of the deposition process.

In some embodiments, a treatment process is performed to improve the quality of the electrode layer 804 (e.g., by removing gaps (e.g., air pockets) 805 including voids and seams formed in the electrode layer 804). The treatment process may include a laser anneal process using a pulsed laser. Laser anneal parameters (e.g., wavelength, pulse duration (pulse width), pulse energy density, repetition rate, treatment time) are tuned so that the gaps in the electrode layer 804 are removed without damaging the fin elements. In some embodiments where the electrode layer 804 includes amorphous silicon, the laser anneal process is controlled so that the thermal budget is sufficiently low to prevent the amorphous silicon of the electrode layer 804 from crystallization (e.g., by keeping the temperature of the amorphous silicon lower than a crystallization temperature of the amorphous silicon).

In some embodiments, the laser anneal parameters are determined based on various properties (e.g., dimensions, composition, reflow point, melting points, and absorption spectrum) of the dielectric material 802, the electrode layer 804, and the fin elements 304. In an example where the electrode layer 804 includes an amorphous material, those properties include a crystallization temperature of the amorphous material of the electrode layer 804.

In some embodiments, the laser anneal process is performed using a laser having wavelength between about 325 nm to about 1700 nm. The laser pulse duration is less than about 500 nanoseconds (ns) (e.g., between about 3 ns to about 5 ns). The laser pulse energy density is between about 10 $mJ/cm^2$ and 800 $mJ/cm^2$. The laser type may be a solid-state type or an excimer type. In a particular example, the laser anneal process uses a laser having a wavelength ranging between about 500 nm to about 600 nm, a pulse duration of about 10 nanoseconds, and a laser pulse energy density of about 20 $mJ/cm^2$. In some embodiments, the laser anneal parameters (e.g., wavelength, pulse duration (pulse width), pulse energy, pulse repetition rate, treatment time, or a combination thereof) of the treatment process applied to the electrode layer 804 are different from the laser anneal parameters of the laser anneal process 500 applied to the isolation features 402 as discussed above with reference to FIG. 5.

Figure 8B:
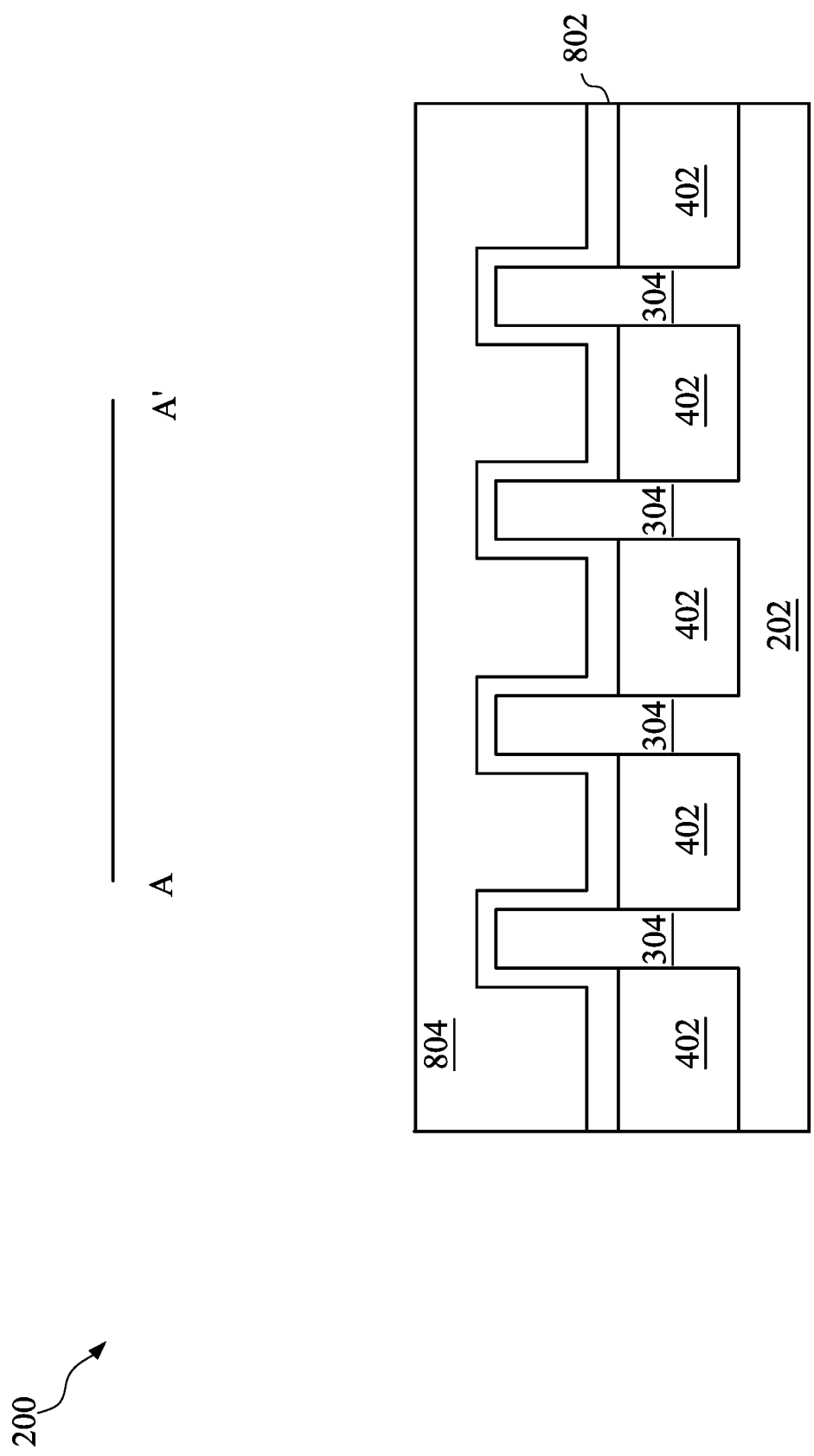
FIG. 8B is a cross-sectional view of a portion of a semiconductor device according to some embodiments.

Referring to FIG. 8B, illustrated is an example of the device 200 after the laser anneal process is performed to treat the electrode layer 804, where the electrode layer 804 does not include any gaps.

Figure 8C:
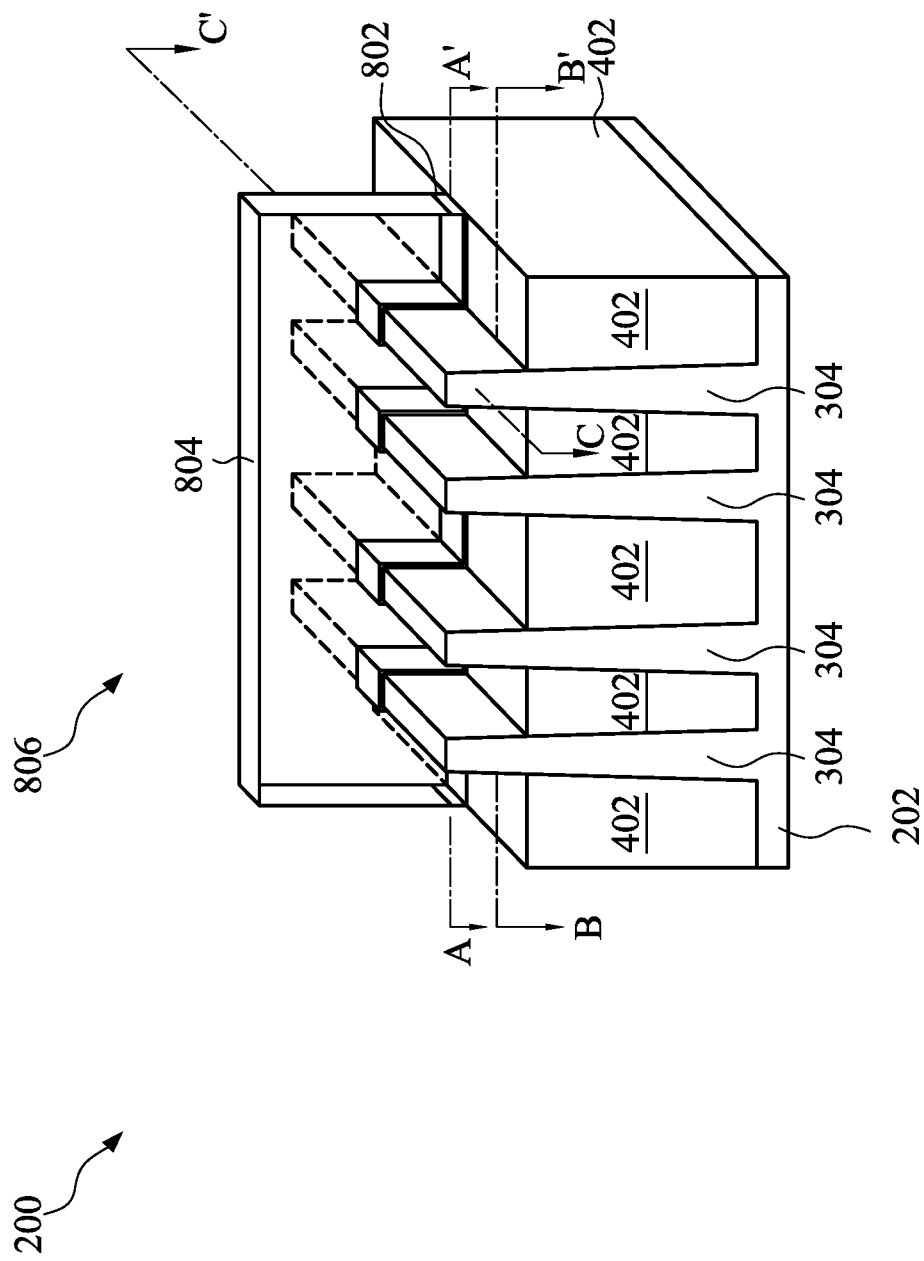
FIG. 8C is an isometric view of a portion of a semiconductor device according to some embodiments.

Referring to the example of FIG. 8C, a dummy gate structure 806 is formed by patterning and etching the dummy gate dielectric material 802 and the dummy gate electrode layer 804. In the example of FIG. 8C, the dummy gate structure 806 is formed over the substrate 202 and is at least partially disposed over the fin elements 304. The dummy gate structure 806 includes the dielectric material 802 and the electrode layer 804. The portion of the fin elements 304 directly underlying the dummy gate structure 806 may be referred to as the channel regions. The dummy gate structure 806 may also define source/drain regions, for example, as the regions of the respective fin elements adjacent to and on opposing sides of the channel regions of the dummy gate structure 806.

Various steps such as layer deposition (e.g., of a hard mask over the dummy gate electrode layer 804), patterning, as well as other suitable steps, are used to form the dummy gate structure 806. Exemplary layer deposition processes includes CVD (including both low-pressure CVD and plasma-enhanced CVD), PVD, ALD, thermal oxidation, e-beam evaporation, or other suitable deposition techniques, or combinations thereof. The patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof.

In some embodiments, etching processes are performed to remove the electrode layer 804 and the dielectric material 802 in the source/drain regions. The etching processes may include dry etching, wet etching, and/or other etching methods. In some examples where the electrode layer 804 includes gaps that cause preferential etching, after the etching processes, there are residues of the electrode layer 804 and the dielectric material 802 in the source/drain regions (e.g., on the top surfaces of the isolation features 402 and fin elements 304 in the source/drain regions). Such residues may cause defect in subsequently formed source/drain features. Therefore, by removing gaps in the electrode layer 804 (e.g., using a laser anneal process), residues in the channel regions are reduced or removed, which help reduce defects in subsequent formed gate structures.

Figure 9:
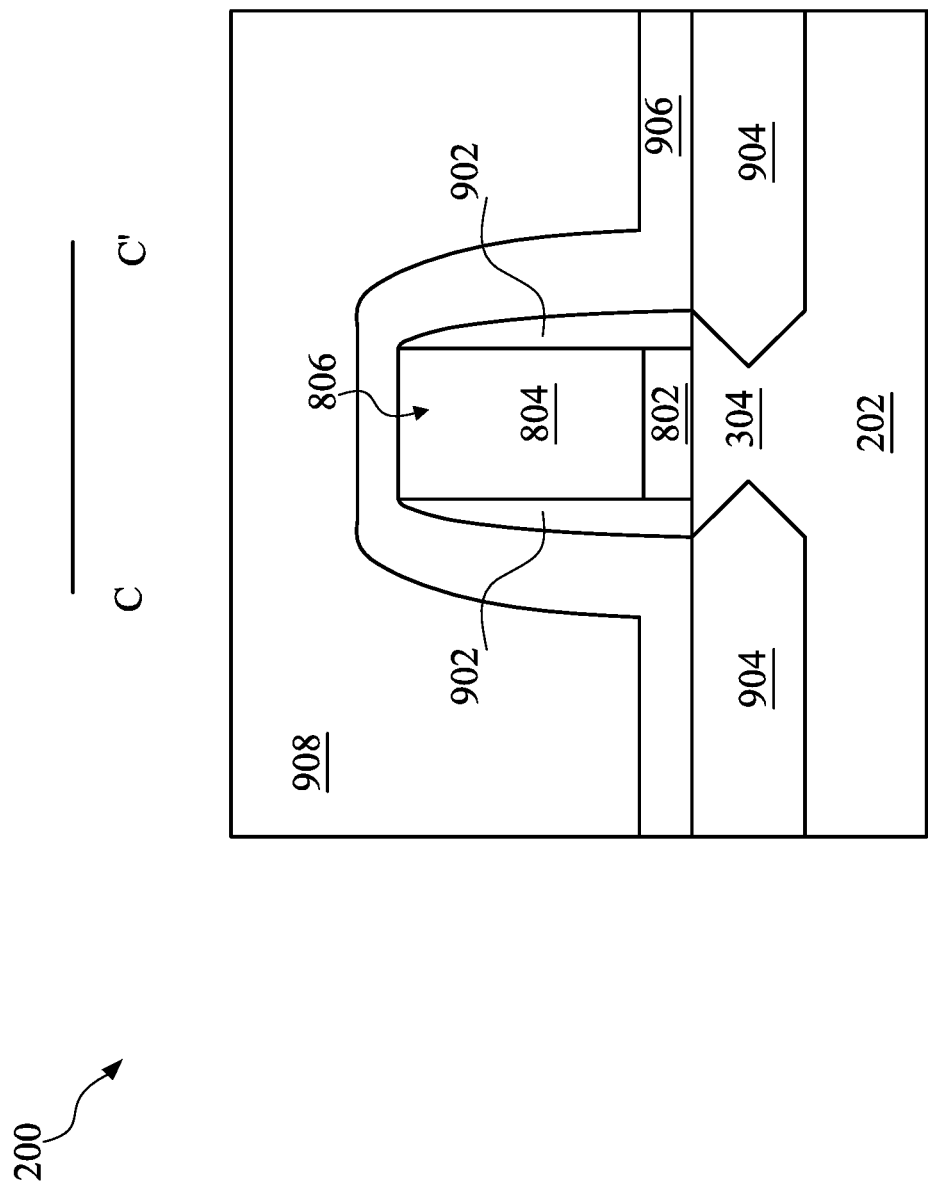
FIG. 9 is a cross-sectional view of a portion of a semiconductor device according to some embodiments.

Referring to FIGS. 1 and 9, the method 100 then proceeds to block 116, where source/drain features are formed in the source/drain regions adjacent to the dummy gate structure, and a first interlayer dielectric (ILD) layer is formed over substrate. Referring to FIG. 9, illustrated is a cross section of a portion of an embodiment of the device 200 along the C-C' line of FIG. 8C. In some embodiments, block 116 includes forming gate spacers 902 on sidewalls of the dummy gate structure 806. The gate spacer may include one or more dielectric materials such as silicon nitride, silicon oxide, silicon carbide, silicon oxycarbide (SiOC), silicon oxycarbon nitride (SiOCN), other materials, or a combination thereof. The spacer layer may include a single layer or a multi-layer structure. The gate spacers 902 may be formed by chemical oxidation, thermal oxidation, ALD, CVD, and/or other suitable methods.

In some embodiments, block 116 includes forming source/drain features by performing an epitaxial growth process in, on, and/or surrounding the fin elements 304 in the source/drain regions. Referring to FIG. 9, in some embodiments, recesses are etched in the source/drain regions of the fin elements 304, for example, by a dry etching process and/or a wet etching process. The source/drain features 904 include a semiconductor material and are formed by epitaxially growing a semiconductor material in the recesses on the fin elements 304. In various embodiments, the grown semiconductor material of source/drain features 904 include Ge, Si, GaAs, AlGaAs, SiGe, GaAsP, SiP, or other suitable material. In some embodiments, the epitaxially grown material of source/drain features 904 is in-situ doped during the epitaxial process. In some embodiments, the epitaxially grown material of source/drain features 904 is not in-situ doped, and, for example, instead an implantation process is performed to dope the epitaxially grown material of source/drain features 904.

In an embodiment, the fin elements 304 are silicon and the epitaxially grown material of source/drain features 904 also is silicon. In some embodiments, the fin elements 304 and the material of the source/drain features 904 may comprise a similar material, but be differently doped. In some embodiments, the fin elements 304 include a first semiconductor material, and the epitaxially grown material of source/drain features 904 includes a second semiconductor different than the first semiconductor material.

In various embodiments, the source/drain features 904 may be grown in different processes or the same processes and/or include different materials and/or dopants or dopant profiles. In an embodiment, the epitaxially grown material of source/drain features 904 is silicon being doped with phosphorous. In a further embodiment, the phosphorous dopant concentration may be between approximately $5 \times 10^{20}$ and approximately $2 \times 10^{21}$ atoms per $cm^3$. The epitaxially grown material of source/drain features 904 may be alternatively suitably doped to include arsenic, antimony, or other N-type donor material.

In some embodiments, block 116 continues to include forming of an etch stop layer. Referring to FIG. 9, an etch stop layer 906 is formed over the gate spacer 902, the dummy gate structure 806, and the source/drain features 904. In some examples, the etch stop layer 906 includes a silicon nitride layer, a silicon carbon nitride layer, a silicon oxynitride layer, and/or other materials. The etch stop layer 906 may be formed by ALD, PECVD, or other suitable deposition or oxidation processes.

In some embodiments, block 116 continues to include forming of an inter-level dielectric (ILD) layer. Referring to FIG. 9, an inter-level dielectric (ILD) layer 908 is formed over the source/drain features 904 in the source/drain region. Exemplary materials of the ILD layer 908 include, for example, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), $SiO_2$, silicon nitride, silicon oxynitride, silicon carbon nitride (SiCN), silicon oxycarbonitride (SiOCN), and/or other suitable dielectric materials. The ILD layer 908 may include a plurality of layers. The ILD layer 908 may be deposited by a PECVD process or other suitable deposition technique. In an embodiment, the ILD layer 908 has a height, for example, between approximately 100 nm and approximately 400 nm (e.g., about 300 nm).

Figure 10:
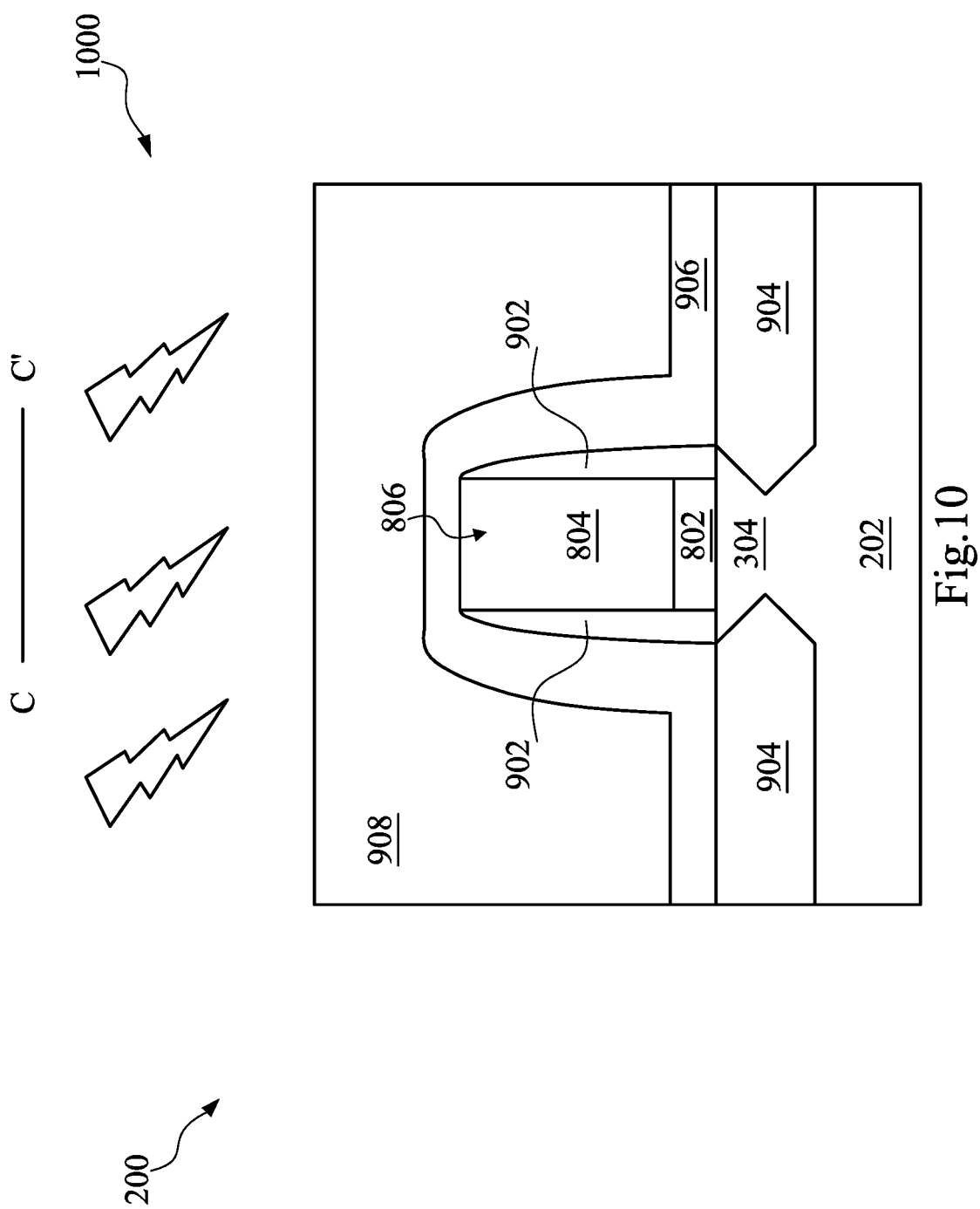
FIG. 10 is a cross-sectional view of a portion of a semiconductor device according to some embodiments.

Referring to FIG. 10, in some embodiments, block 116 continues to include performing an annealing process 1000 to treat the ILD layer 908. In some examples, the annealing process 1000 converts a flowable dielectric material of the ILD layer 908, at least partially, to a dense oxide material. In some examples, the annealing process the ILD layer 908 enhances the quality of the ILD layer 908 through solvent out-diffusion and/or cross-linking. In some examples, the annealing process 1000 is conducted in an oxidizing ambient, a combination of steam ambient and oxygen ambient, or under an inert gas atmosphere. In some embodiments, the annealing process 1000 includes placing the device 200 in a furnace, where the furnace is heated to a particular annealing temperature. The annealing process 1000 meets certain thermal budget by controlling the annealing parameters, for example, the annealing temperature and the annealing duration. In some examples, the annealing process 1000 is performed at an annealing temperature between about 850° C. and about 1,050° C. for a duration between about 0.5 seconds to about 15 seconds. In some examples, the annealing process 1000 is performed at an annealing temperature between about 200° C. and about 500° C. for a duration from about 10 minutes to about 2 hours.

In various embodiments, the ILD layer 908 may be a relatively thick layer. In one example, the ILD layer 908 has a thickness about 300 nm as it is first deposited. Consequently, the annealing process 1000 may not be able to penetrate such a thick layer. Accordingly, further operations are performed to fully treat the ILD layer 908. To further these embodiments, block 116 continues to perform a chemical mechanical planarization (CMP) process to the ILD layer 908 to thin it down, and thereafter, proceeds to perform another annealing process to fully convert the flowable dielectric material of the ILD layer 908 to a dense oxide material.

Figure 11:
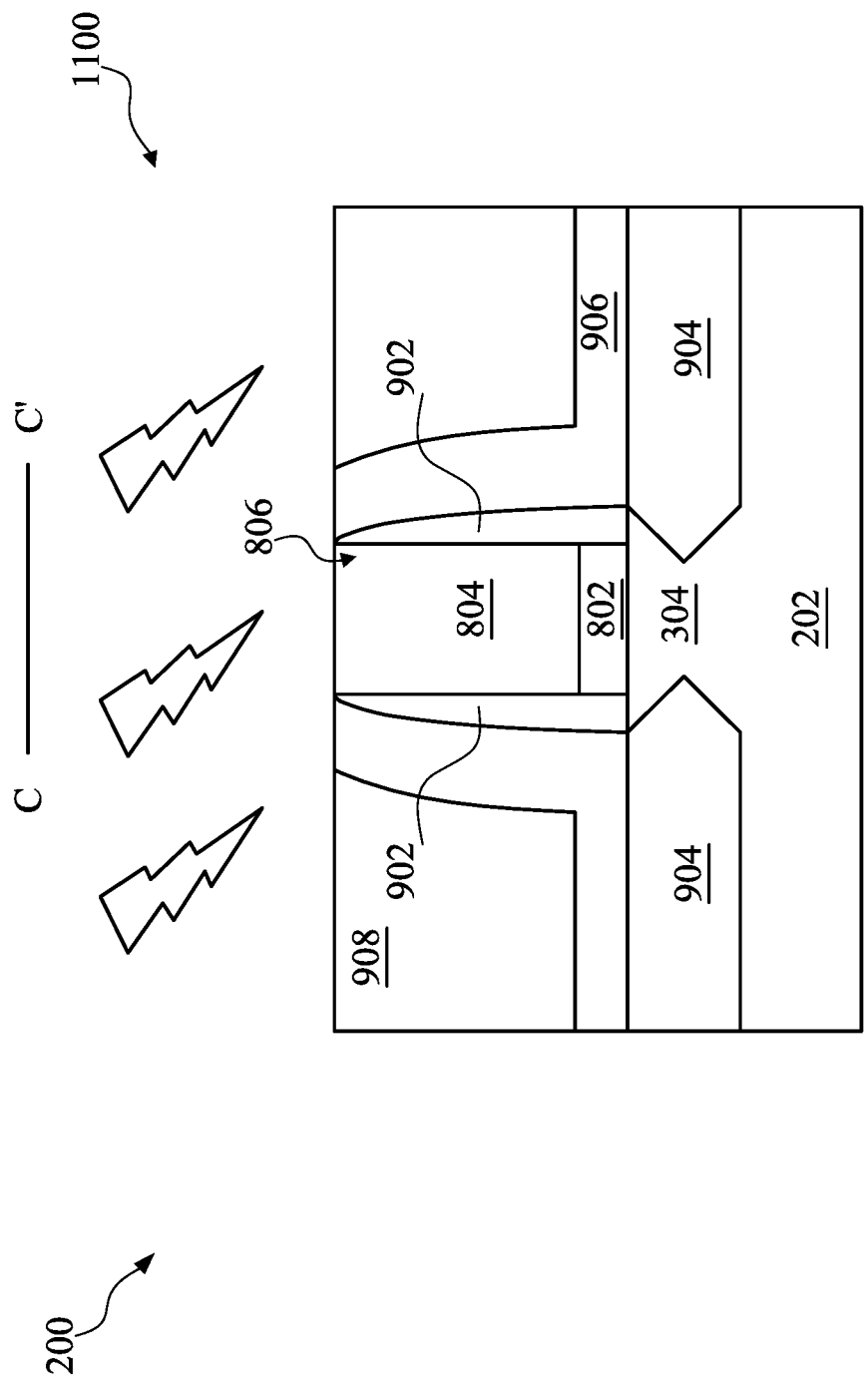
FIG. 11 is a cross-sectional view of a portion of a semiconductor device according to some embodiments.

Referring to the example of FIG. 11, the ILD layer 908 has been thinned and planarized, for example by a chemical mechanical polishing (CMP) process, and a top surface of the dummy gate structure 806 is exposed. As illustrated in FIG. 11, after the CMP process is completed, the ILD layer 908 has a height, for example, between about 80 nm and about 150 nm. Another annealing process 1100 is performed to the substrate 202 to treat the ILD layer 908. The annealing process 1100 may be substantially similar to the annealing process 1000 discussed above with reference to FIG. 10. The annealing process 1100 fully penetrates the ILD layer 908 and converts it to a dense oxide layer. In some embodiments, the annealing process 1100 includes placing the device 200 in a furnace, where the furnace is heated to a particular annealing temperature. In an embodiment, the annealing process 1100 is performed at an annealing temperature between about 850° C. and about 1,050° C. for a duration between about 0.5 seconds to about 15 seconds. In some examples, the annealing process 1100 is performed at an annealing temperature between about 200° C. and about 500° C. for a duration from about 10 minutes to about 2 hours.

Figure 12:
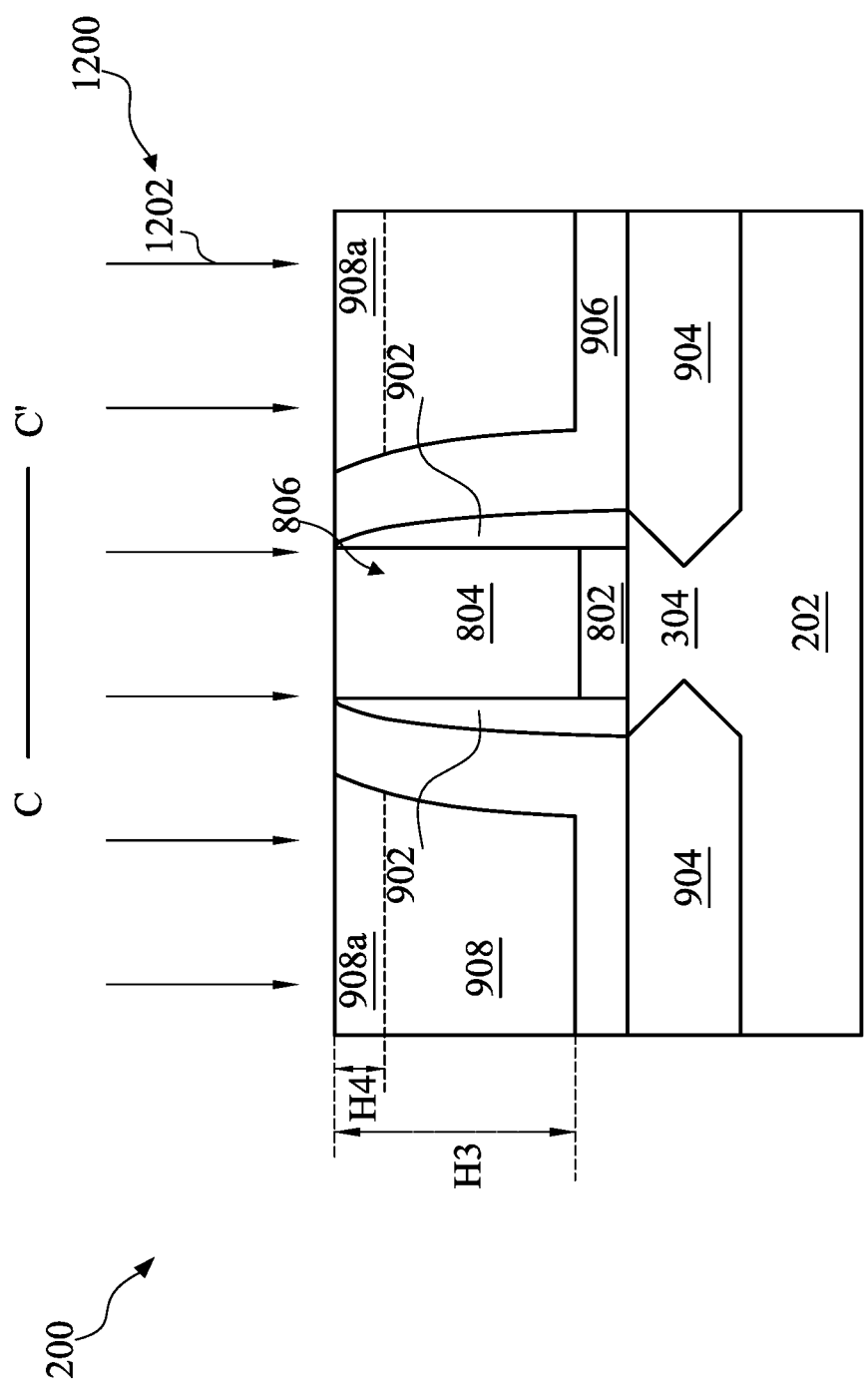
FIG. 12 is a cross-sectional view of a portion of a semiconductor device according to some embodiments.

Referring to FIGS. 1 and 12, the method 100 proceeds to block 118, where a laser anneal process is performed to the ILD layer to reduce its wet etch rate. In the example of FIG. 12, a laser anneal process 1200 irradiates the substrate with a laser radiation 1202. In some embodiments, the laser anneal process 1200 reduces an etch rate of the ILD layer 908 in a particular solution by about 5% and up to about 50%. In an example, the particular solution is used in subsequent etch steps to remove the dummy gate structure 806 as described below. In some embodiments, the reduction of the etch rate is caused by the formation of stronger bonds during the laser anneal process 1200. In some examples, bonds (e.g., Si-N, Si—H, H—N bonds) having weaker bond energies in the ILD layer 908 are broken, and bonds (e.g., Si—O bonds) having stronger bond energies are formed in the ILD layer 908. In some examples, weaker Si—O bonds in the ILD layer 908 (e.g., where a silicon atom is bonded to less than four oxygen atoms) break by the laser anneal process 500, and re-bond to form stronger Si—O bonds (e.g., silicon-oxygen tetrahedron where each silicon atom is bonded to four oxygen atoms). In some examples, weaker Si—O bonds (e.g., where a silicon atom is bonded to less than four oxygen atoms) in the isolation features 402 break by the laser anneal process 500, and re-bond to form stronger Si—O bonds (e.g., forming silicon-oxygen tetrahedron where a single silicon atom is bonded to four oxygen atoms) during a cooling process. In some examples, the laser anneal process reduces dangling Si bonds in the ILD layer 908, where the dangling Si bonds react with oxygen to form Si—O bonds. In some embodiments, normalized Fourier Transform Infrared (FTIR) spectroscopy can be used to detect the change of the status of Si—O bonds (e.g., the asymmetric stretch mode) and evaluate the quality of silicon oxide.

In some embodiments, during the laser anneal process 1200, the ILD layer 908 has a temperature (e.g., in a range of from about 1200° C. to about 1400° C.) lower than the melting point (e.g., 1600° C.) of the ILD layer 908. Such a laser anneal process may also be referred to as a sub-melt laser anneal process. In some embodiments, during the laser anneal process 1200, the ILD layer 908 has a temperature equal to or greater than the melting point of the ILD layer 908. Such a laser anneal process may also be referred to as a melt laser anneal process.

In some embodiments, an anneal depth of the laser anneal process 1200 indicates a depth of a portion of the ILD layer 908 which is annealed by the laser anneal process 1200 and has an improved wet etch rate. In some embodiments, the laser anneal parameters are tuned based on the height H3 of the ILD layer 908 so that an anneal depth of the laser anneal process 1200 is equal to or greater than the height H3. In such embodiments, the entire ILD layer 908 is annealed by the laser anneal process 1200.

In some embodiments, the laser anneal parameters are tuned so that an anneal depth (e.g., H4) of the laser anneal process 1200 is less than the height H3. As such, the thermal changes caused by the laser anneal process 1200 are constrained in a top portion (e.g., a portion 908a), which help lower the thermal budget of the laser anneal process 1200. In such embodiments, the laser anneal process 1200 reduces an etch rate of the top portion 908a, while an etch rate of the bottom portion of the ILD layer 908 remains substantially unchanged during the laser anneal process 1200.

In some examples, the laser anneal process 1200 uses a pulsed laser radiation 1202 having a wavelength ranging between about 300 nm to about 600 nm (e.g., about 600 nm), a pulse duration ranging from about 2 ns to about 200 ns (e.g., about 15 ns), and a laser pulse energy density ranging between about 1 mJ/cm$^2$ to about 10 J/cm$^2$ (e.g., 50 mJ/cm$^2$). The pulsed laser radiation 1202 irradiates a 10 mm by 10 mm area of the surface of the ILD layer 908 using about 1 to 100 pulses (e.g., 40 pulses), and is stepped to cover the surface of the ILD layer 908. In some examples, the laser anneal parameters (e.g., wavelength, pulse duration (pulse width), pulse energy density, number of pulses, repetition rate) of the laser anneal process 1200 are different from the laser anneal parameters of the laser anneal process 500 described above with reference to FIG. 5 and the laser anneal parameters of the laser anneal process applied to the electrode layer 804 described above with reference to FIG. 8A.

In some embodiments where the electrode layer 804 includes polysilicon (e.g., recrystallized polysilicon from amorphous silicon), there are residues after a subsequent wet etching process is performed to remove the electrode layer 804. Such residues may be caused by different etching rates along different orientation in polysilicon. In some embodiments, where at block 114, an electrode layer 804 including amorphous silicon is formed, because of the low thermal budget of the processes at blocks 116 and 118 (e.g., the annealing processes 1000, 1100, the laser anneal process 1200), the amorphous silicon of the electrode layer 804 remains amorphous (e.g., without crystallizing to form polysilicon) during blocks 116 and 118 until the electrode layer 804 is removed at block 120 for better silicon line width roughness (LWR) and line edge roughness (LER) control. Thus, by keeping the amorphous structure of the amorphous silicon, residues after performing the subsequent wet etching process to remove the electrode layer 804 are eliminated and/or reduced.

Figure 13A:
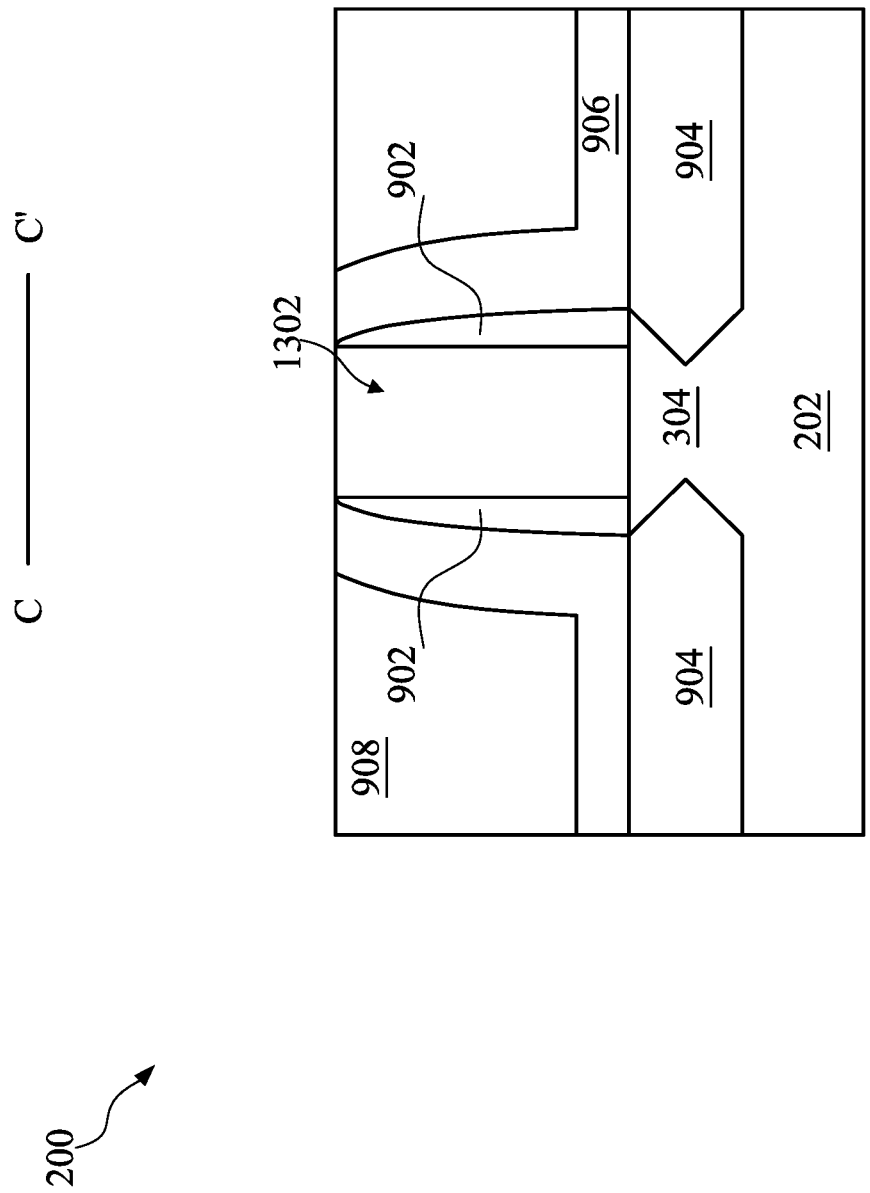
FIGS. 13A and 13B are cross-sectional views of a portion of a semiconductor device according to some embodiments.
Figure 13B:
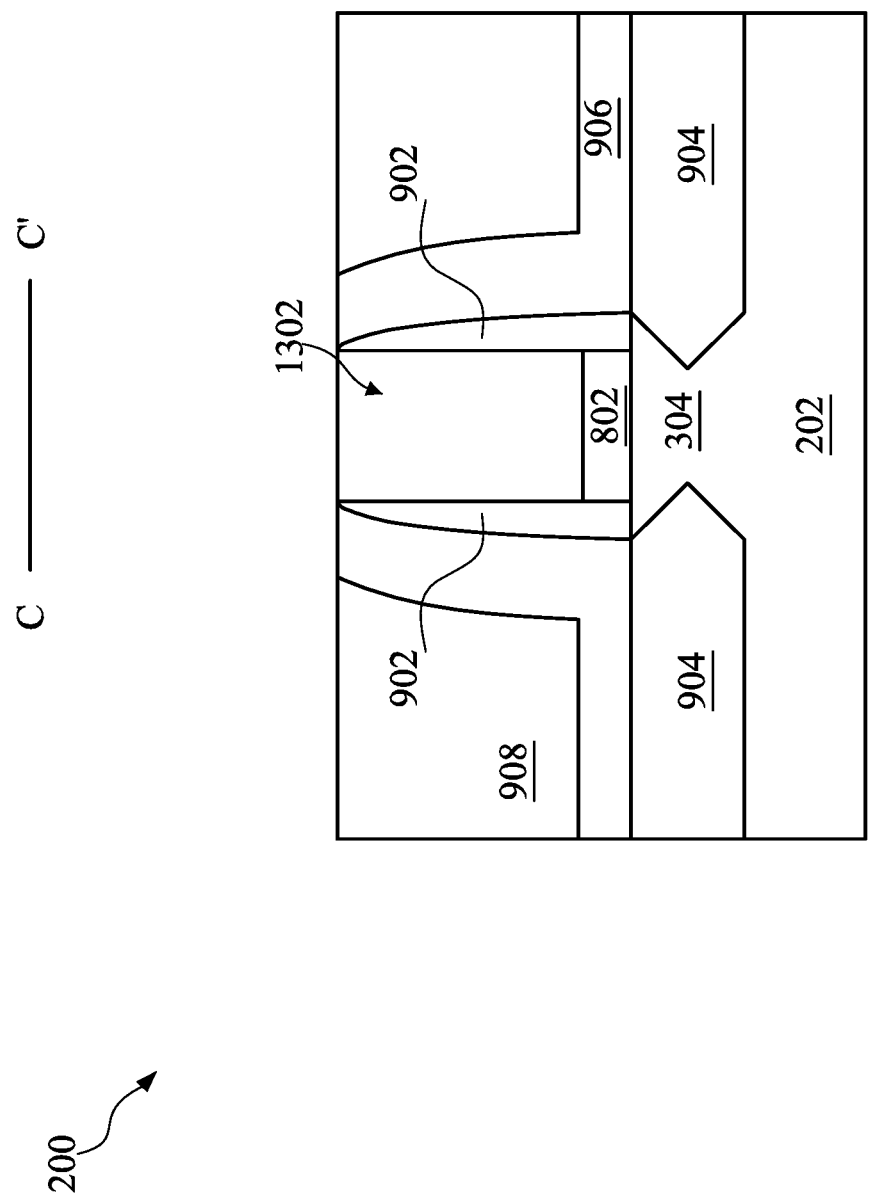

Referring to FIGS. 1, 13A, and 13B, the method 100 then proceeds to block 120, where the dummy gate structure 806 is removed. Referring to FIG. 13A, illustrated therein is a cross-sectional view of the device 200 along the C-C' line of FIG. 8C, where both the dielectric material 802 and the electrode layer 804 of the previously formed dummy gate structure 806 are removed from the substrate 202. The removal of the dielectric material 802 and the electrode layer 804 of the dummy gate structure 806 results in an opening or trench 1302 exposing the top portions of the fin elements 304 in the channel regions.

Referring to FIG. 13B, illustrated therein is a cross-sectional view of the device 200 along the C-C' line of FIG. 8C, where after removing the electrode layer 804 of the dummy gate structure 806, the dielectric material 802 of the dummy gate structure 806 is not removed. The removal of the electrode layer 804 results in a trench 1302, exposing the dielectric material 802 of the dummy gate structure 806. This dielectric material 802 is used as a high-k dielectric layer of the gate structure in subsequent steps as described below.

In some embodiments, etching processes are performed to remove the electrode layer 804 and/or the dielectric material 802 of the dummy gate structure 806. The etching processes may include dry etching (e.g., RIE etching), wet etching, and/or other etching methods. In some examples, by reducing the etch rate of the ILD layer 908 (or a portion thereof) in block 118, a desired etch selectivity for the ILD layer 908 and the dummy gate structure 806 is achieved. The ILD layer 908 remains substantially unchanged by the etching processes to remove the dummy gate structure 806.

Figure 14:
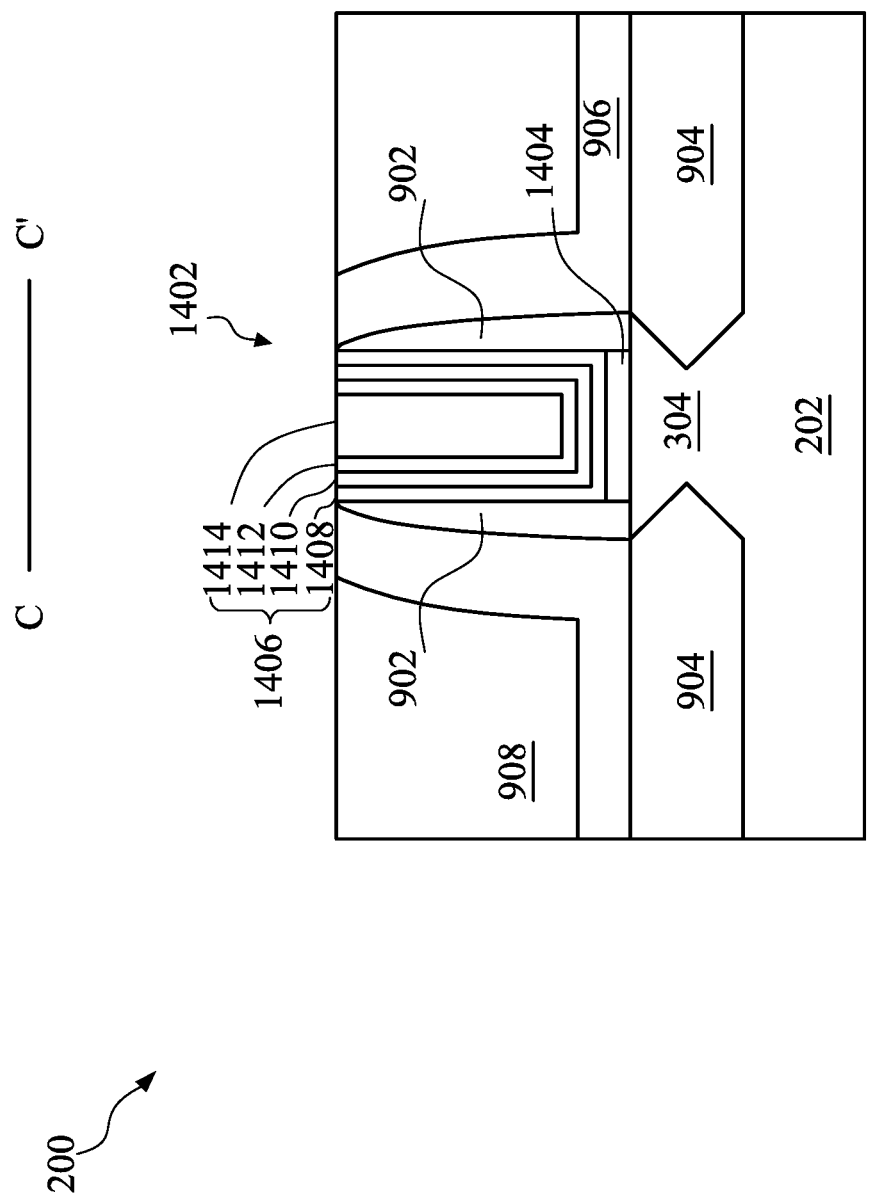
FIG. 14 is a cross-sectional view of a portion of a semiconductor device according to some embodiments.
Figure 15:
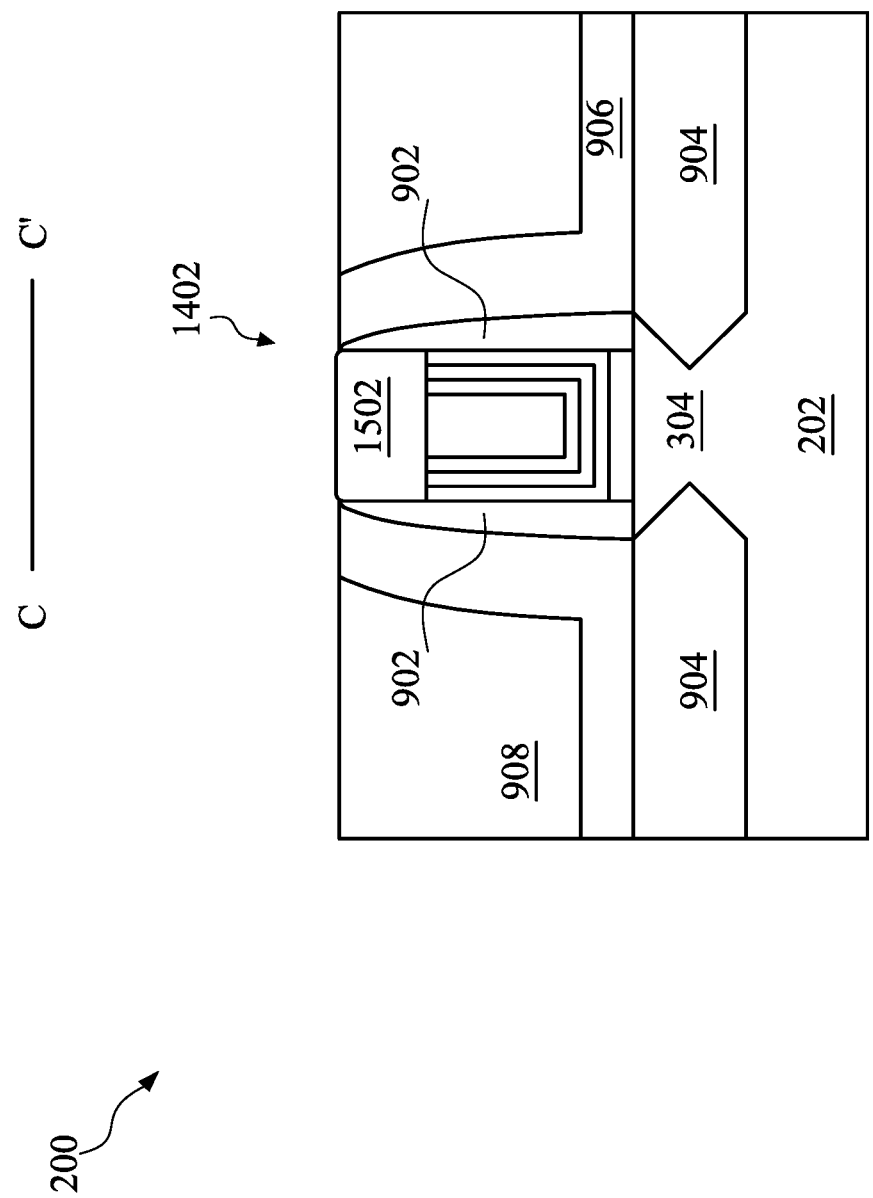
FIG. 15 is a cross-sectional view of a portion of a semiconductor device according to some embodiments.
Figure 16:
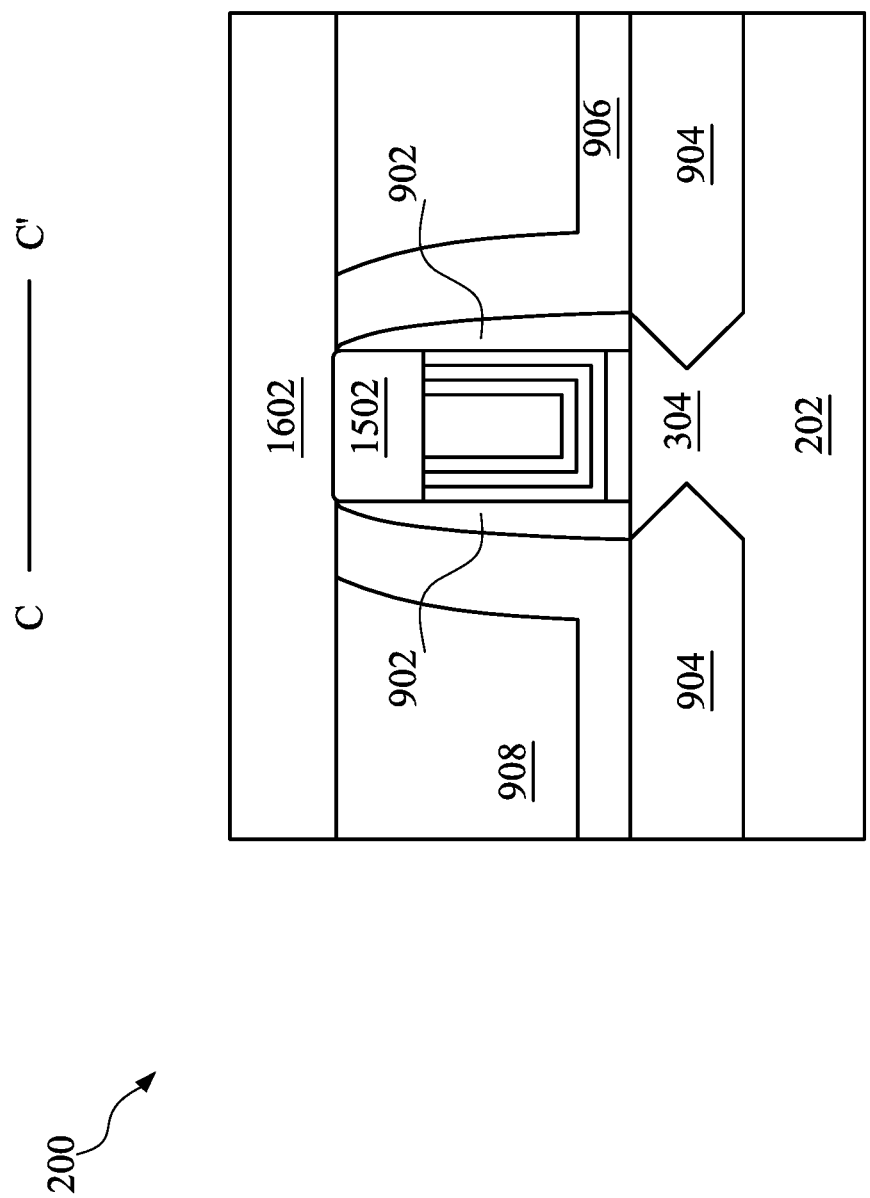
FIG. 16 is a cross-sectional view of a portion of a semiconductor device according to some embodiments.

Referring to FIGS. 1 and 14, the method 100 then proceeds to block 120, where a replacement gate is formed. Referring to the example of FIG. 14, illustrated is a cross-sectional view along of a device 200 line C-C' of FIG. 8C, where a gate structure 1402 is formed in the trench or opening over the fin elements 304 in the channel region, so that the fin elements 304 become the fins elements of a FinFET 200. In various embodiments, the gate structure 1402 may include a high-k gate dielectric layer 1404 (or the dielectric layer 802) formed over the channel region of the fin elements 304. High-k gate dielectrics, as used and described herein, include dielectric materials having a high dielectric constant, for example, greater than that of thermal silicon oxide (~3.9). The gate dielectric layer may be formed by ALD, physical vapor deposition (PVD), CVD, oxidation, and/or other suitable methods.

In some embodiments, the gate structure 1402 includes a metal layer 1406 formed over the high-k gate dielectric layer 1404. The metal layer 1406 used within high-k/metal gate stack may include a metal, metal alloy, or metal silicide. The metal layer 1406 may include a single layer or alternatively a multi-layer structure, such as various combinations of a metal layer with a selected work function to enhance the device performance (work function metal layer), liner layer, wetting layer, adhesion layer, metal alloy or metal silicide. By way of example, the metal layer 1406 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In addition, the metal layer 1406 may provide an N-type or P-type work function, may serve as a transistor (e.g., FinFET) gate electrode, and in at least some embodiments, the metal layer 1406 of the gate structure 1402 includes a polysilicon layer. In the example of FIG. 14, the metal layer 1406 includes a capping layer 1408, a blocking layer 1410, a work function metal layer 1412, and a filling metal layer 1414. In furtherance of the embodiments, the capping layer 1408 includes titanium nitride, tantalum nitride, or other suitable material, formed by a proper deposition technique such as ALD. The blocking layer 1410 includes titanium nitride, tantalum nitride, or other suitable material, formed by a proper deposition technique such as ALD. In some embodiments, the work function metal layer 1412 includes titanium nitride (TiN) or tantalum nitride (TaN) or includes various metal-based films as a stack for optimized device performance and processing compatibility. The work function metal is deposited by a suitable technique, such as PVD. The filling metal layer 1414 includes aluminum, tungsten or other suitable metal. The filling metal layer 1414 is deposited by a suitable technique, such as PVD or plating.

In various embodiments, the metal layer 1406 of the gate structure 1402 may be formed by ALD, PVD, CVD, e-beam evaporation, or other suitable process. Further, the metal layer 1406 of the gate structure 1402 may be formed separately for N-FET and P-FET transistors which may use different metal layers. In various embodiments, a CMP process may be performed to remove excessive metal from the metal layer 1406 of the gate structure 1402, and thereby provide a substantially planar top surface of the metal layer 1406 of the gate structure 1402.

Referring to FIGS. 1, 15, 16, 17, and 18, the method 100 proceeds to block 124, where various contacts are formed. Referring to the example of FIG. 15, the metal layer 1406 is etched back to form a recess, and silicon (e.g., polysilicon) 1502 is grown in the recess. Referring to the example of FIG. 16, an ILD layer 1602 is formed on the substrate 202, the silicon 1502, and the gate structure 1402. The ILD layer 1602 is deposited by a proper technique, such as CVD. The ILD layer 1602 includes a dielectric material, such as silicon oxide, low k dielectric material or a combination. Then a chemical mechanical polishing (CMP) process may be applied thereafter to planarize the surface of the surface of the ILD layer 1602.

Figure 17:
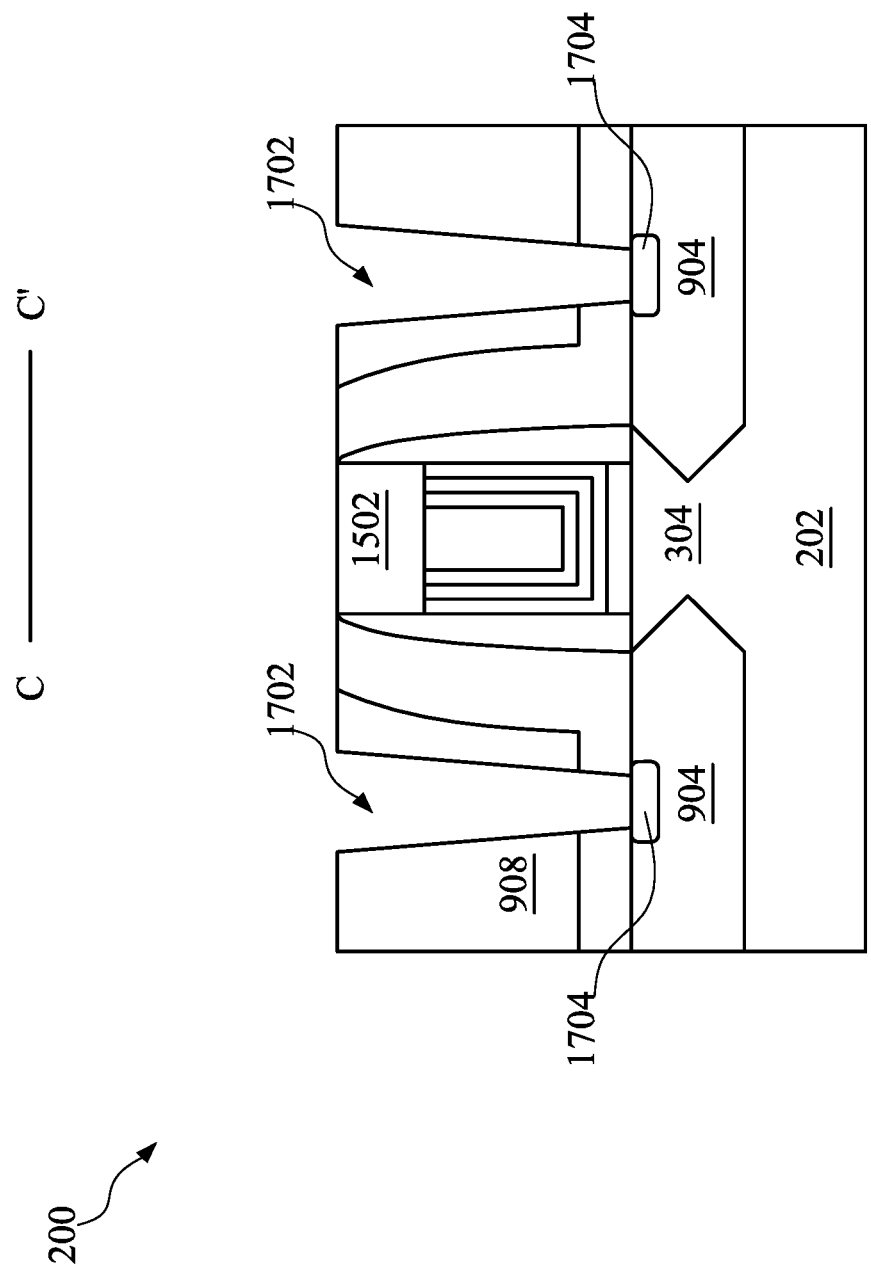
FIG. 17 is a cross-sectional view of a portion of a semiconductor device according to some embodiments.

Referring to the example of FIG. 17, contact holes 1702 are formed through the ILD layer 1602 and the ILD layer 908. The formation of the contact holes 1702 includes etching the ILD layers 1602 and 908 using dry etching, wet etching, and/or a combination thereof. The source/drain features 904 are exposed within the contact holes 1702. In some embodiments, after the formation of the contact holes 1702, the ILD layer 1602 is removed, for example, by an etching process. In some embodiments, an ion pre-amorphorized implantation (PAI) process is performed to the exposed source/drain features 904, thereby generating amorphous regions 1704 for better silicide formation in subsequent steps. The PAI process is applied to the semiconductor substrate 202, using the gate structure 1402, the ILD layer 908, and the isolation features 402 collectively as an implantation mask, so that the amorphous regions 1704 are created in the source/drain features 904 exposed within the contact holes 1702. In some embodiments, the PAI process includes an ion implantation process using species selected from silicon, germanium, or a combination thereof. The PAI process is designed with various conditions tuned to effectively convert the source/drain regions to amorphous regions.

Figure 18:
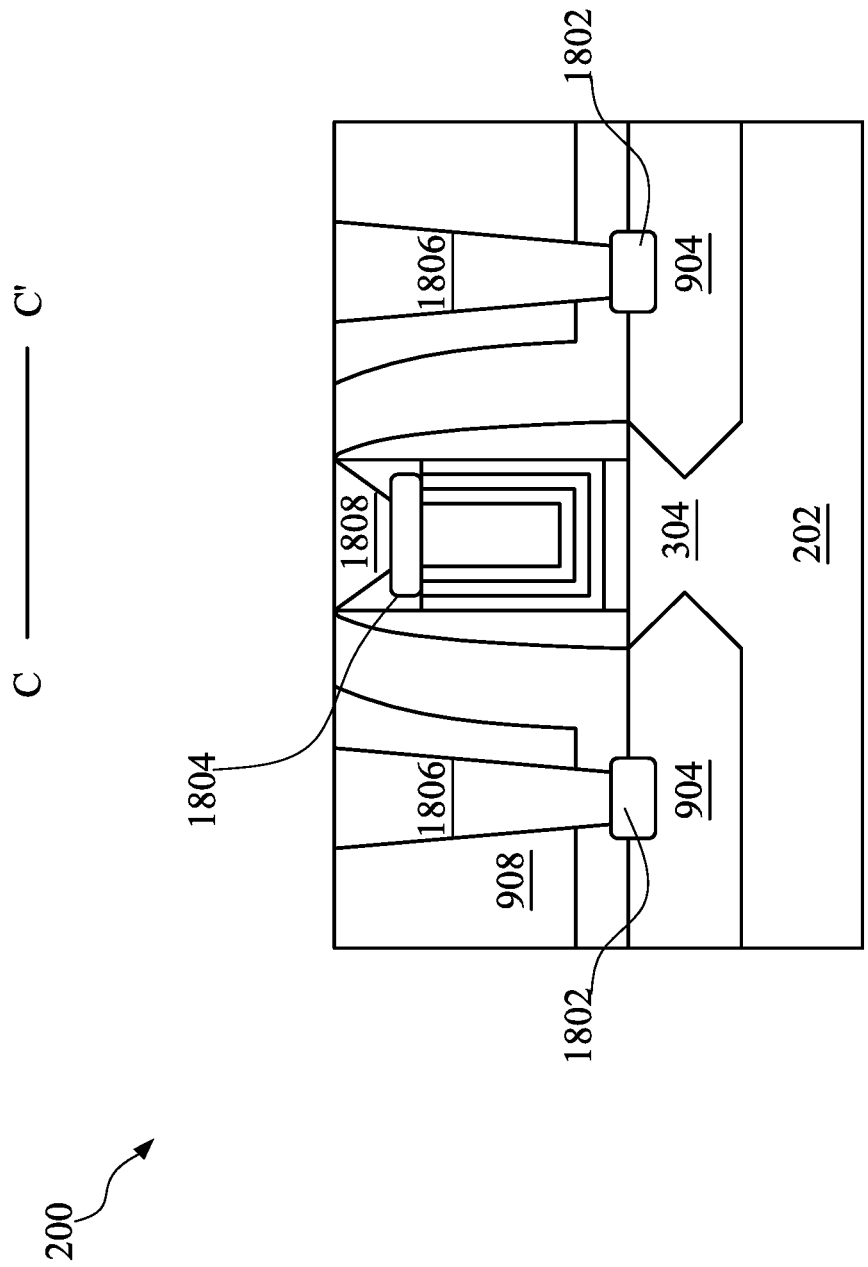
FIG. 18 is a cross-sectional view of a portion of a semiconductor device according to some embodiments.

Referring to the example of FIG. 18, silicide features 1802 are formed on the source/drain features 904, for example, to reduce the contact resistance. In some embodiments, a gate contact hole is formed in the silicon 1502, exposing a metal layer 1406 in the gate contact hole. A silicide feature 1804 is formed over the metal layer 1406 exposed in the gate contact hole. In some embodiments, the silicide features 1802 and 1804 may be formed by a technique referred to as self-aligned silicide (salicide), which includes metal deposition (such as titanium, tantalum or nickel deposition) onto a silicon substrate, and a thermal anneal to react the metal with silicon to form silicide, and may further includes an etch to removed un-reacted metal.

In some examples, the silicide features are formed by depositing two metal films: a titanium (Ti) film and a titanium nitride (TiN) film on the Ti film. After the metal deposition (Ti and TiN in the present embodiment), an annealing process is applied to react the metal with silicon, thereby forming the silicide features 1802 and 1804. In the present example, Ti silicide (TiSi) features are formed on the source/drain features 904 and the gate structure 1402.

In the example of FIG. 18, contact features 1806 are formed in the contact holes 1702, and contact feature 1808 is formed in the gate contact hole by deposition using one or more conductive materials, such as tungsten, aluminum or other suitable conductive material. The formation of the contact features may further includes applying a CMP process to remove excessive the conductive material deposited on the ILD layer 908.

The FinFET device 200 may undergo further processing to form various features and regions. For example, subsequent processing may form contact openings, contact metal, as well as various contacts, vias, wires, and multilayer interconnect features (e.g., metal layers and inter-level dielectrics) on the substrate 202, configured to connect the various features to form a functional circuit that may include one or more other devices. In furtherance of the example, a multilayer interconnection may include vertical interconnects, such as vias and contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or removed in accordance with various embodiments of the method 100.

The embodiments of the present disclosure offer advantages over existing art, though it is understood that other embodiments may offer different advantages, not all advantages are necessarily discussed herein, and that no particular advantage is required for all embodiments. One of the advantages in some embodiments is that by using a pulsed laser having a short pulse duration (e.g., less than about 500 ns) in an isolation feature treatment process, a low thermal budget solution for reducing the wet etch rate of isolation features is achieved without damaging the fin elements, inducing undesired dopant diffusion, or negatively impacting stressed features. Another advantage in some embodiments is that by using a pulsed laser having a short pulse duration (e.g., less than about 500 ns) in an ILD layer laser treatment process, a low thermal budget solution for reducing the wet etch rate of an ILD layer is achieved. In an example, a dummy gate structure includes an amorphous material (e.g., amorphous silicon), which remains amorphous during the ILD layer laser treatment process due to the low thermal budget of the ILD layer laser treatment process.

Thus, in an embodiment provided is a method of semiconductor device fabrication includes providing a substrate having a hardmask layer thereover. The hardmask layer is patterned to expose the substrate. The substrate is etched through the patterned hardmask layer to form a first fin element and a second fin element extending from the substrate. An isolation feature between the first and second fin elements is formed, where the isolation feature has a first etch rate in a first solution. A laser anneal process is performed to irradiate the isolation feature with a pulsed laser beam. A pulse duration of the pulsed laser beam is adjusted based on a height of the isolation feature. The isolation feature after performing the laser anneal process has a second etch rate less than the first etch rate in the first solution.

The present disclosure also provides an embodiment of a method includes providing a substrate having a dummy gate structure and source/drain features disposed adjacent to the dummy gate structure. A dielectric material layer is formed over the substrate. A laser anneal process is performed to irradiate the dielectric material layer with a pulsed laser beam. An energy applied to the dielectric material layer using the pulsed laser beam is adjusted based on a height of the dielectric material layer.

The present disclosure also provides an embodiment of a method of semiconductor device fabrication includes providing a substrate including a plurality of fin elements extending from the substrate. Isolation features disposed between adjacent fin elements are formed. The isolation features are irradiated using a first pulsed laser beam having a first pulse duration. A dummy gate structure is formed over the substrate. An inter-level dielectric (ILD) layer is deposited over the substrate. The ILD layer is irradiated using a second pulsed laser beam having a second pulse duration different from the first pulse duration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
providing a substrate having a hardmask layer thereover;
patterning the hardmask layer to expose the substrate;
etching the substrate through the patterned hardmask layer to form a first fin element and a second fin element extending from the substrate;

forming an isolation feature between the first and second fin elements, wherein the isolation feature has a first etch rate in a first solution; and performing a laser anneal process to irradiate a top portion of the isolation feature with a pulsed laser beam, wherein performing the laser anneal process includes adjusting a pulse duration of the pulsed laser beam based on a height of the top portion of the isolation feature, and wherein the top portion of the isolation feature has a second etch rate less than the first etch rate in the first solution after the performing the laser anneal process and wherein a bottom portion of the isolation feature has the first etch rate in the first solution after the performing the laser anneal process.

2. The method of claim 1, wherein performing the laser anneal process includes determining a pulse number of the laser anneal process based on a melting point of the isolation feature.

3. The method of claim 1, wherein the pulse duration of the pulsed laser beam is less than 200 nano seconds.

4. The method of claim 1, further comprising removing the patterned hardmask layer by an etching process using the first solution after performing the laser anneal process.

5. The method of claim 1, wherein the hardmask layer includes an oxide layer.

6. The method of claim 1, wherein performing the laser anneal process includes heating the isolation feature to a temperature less than a melting point of the isolation feature.

7. The method of claim 1, wherein forming the isolation feature includes:
filling a trench between the first and second fin elements with a dielectric material; and
performing an annealing process to the dielectric material to increase a density of the isolation feature.

8. A method comprising:
forming a gate structure over a substrate;
performing a heat anneal process on the substrate having the dielectric material layer formed thereon;
after performing the heat anneal process, performing a laser anneal process to irradiate the dielectric material layer with a pulsed laser beam, wherein the performing the laser anneal process includes:
adjusting an energy applied to the dielectric material layer using the pulsed laser beam based on a height of the dielectric material layer; and
heating the dielectric material layer to a temperature less than a melting point of the dielectric material layer.

9. The method of claim 8, wherein the adjusting of the energy applied to the dielectric material layer includes adjusting a laser anneal parameter selected from the group consisting of a pulse duration, a pulse energy density, and a pulse number of the laser anneal process.

10. The method of claim 8, wherein prior to performing the laser anneal process, the dielectric material layer has a first etch rate in a first solution; and
wherein after the performing the laser anneal process, a top portion of the dielectric material layer has a second etch rate less than the first etch rate in the first solution, and a bottom portion of the dielectric material layer has the first etch rate in the first solution.

11. The method of claim 10, further comprising forming a gate structure over the substrate before performing the laser anneal process and removing the gate structure by an etching process using the first solution after performing the laser anneal process, and wherein removing the gate structure includes forming a trench in the dielectric material layer.

12. The method of claim 11, further comprising forming a gate electrode in the trench.

13. The method of claim 8, wherein the forming the dielectric material layer includes forming the dielectric material layer between a first portion of a hardmask over the substrate and a second portion of the hardmask, and wherein the method further comprises removing the hardmask after performing the laser anneal process.

14. The method of claim 8, wherein the dielectric material layer is of a material selected from nitrides, carbonitrides, and oxides.

15. The method of claim 8, wherein the performing of the heat anneal process includes heating at a temperature about 850° C. to about 1,150° C.

16. A method comprising:
etching a substrate through a patterned hardmask layer over the substrate, thereby forming a first fin element and a second fin element extending from the substrate;
forming an isolation feature between the first and second fin elements;
performing a first laser anneal process to irradiate the isolation feature with a first pulsed laser beam, wherein performing the first laser anneal process includes:
adjusting an energy applied to the isolation feature using the first pulsed laser beam based on a height of the isolation feature; and
removing the patterned hardmask layer after performing the first laser anneal process to expose a top surface of the first fin element, wherein the top surface of the first fin element extends below a top surface of the isolation feature.

17. The method of claim 16,
wherein prior to the performing the first laser anneal process, the isolation feature has a first etch rate in a first solution, and
wherein after the performing the first laser anneal process, the isolation feature has a second etch rate less than the first etch rate in the first solution.

18. The method of claim 16, wherein performing the first laser anneal process includes determining a pulse number of the first laser anneal process based on a melting point of the isolation feature, such that the isolation feature is heated to a temperature less than the melting point.

19. The method of claim 16, further comprising:
forming a gate structure over the substrate and a source/drain feature adjacent to the gate structure;
forming a dielectric material layer over the substrate; and
performing a second laser anneal process to irradiate the dielectric material layer with a second pulsed laser beam, wherein the performing the second laser anneal process includes:
adjusting an energy applied to the dielectric material layer using the second pulsed laser beam based on a height of the dielectric material layer.

20. The method of claim 16,
wherein the isolation feature includes a top portion and a bottom portion, wherein the first laser anneal process irradiates the top portion, and wherein the top portion has a smaller etch rate in an etch solution after the first laser anneal process than the bottom portion in the etch solution.

* * * * *